(12) United States Patent
Mignoli et al.

(10) Patent No.: US 11,452,190 B2
(45) Date of Patent: Sep. 20, 2022

(54) DETECTING SHORT CONNECTIONS IN A PLURALITY OF LED CHANNELS

(71) Applicant: Infineon Technologies AG, Neubiberg (DE)

(72) Inventors: Franco Mignoli, Verona (IT);
Hans-Peter Kreuter, Villach (AT);
Alfonso Nasciuti, Parma (IT); Marco Pamato, Schio (IT); Damiano Sartori, Padua (IT)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 16/945,021

(22) Filed: Jul. 31, 2020

(65) Prior Publication Data
US 2022/0039237 A1    Feb. 3, 2022

(51) Int. Cl.
| | |
|---|---|
| *H05B 45/52* | (2020.01) |
| *H05B 45/10* | (2020.01) |
| *H05B 47/155* | (2020.01) |
| *G01R 31/52* | (2020.01) |
| *G01R 31/26* | (2020.01) |

(52) U.S. Cl.
CPC ......... *H05B 45/52* (2020.01); *G01R 31/2635* (2013.01); *G01R 31/52* (2020.01); *H05B 45/10* (2020.01); *H05B 47/155* (2020.01)

(58) Field of Classification Search
None
See application file for complete search history.

(56) References Cited

U.S. PATENT DOCUMENTS

| | | | |
|---|---|---|---|
| 6,940,299 B1 | 9/2005 | Lim et al. | |
| 7,049,842 B2 | 5/2006 | Lopezdenava | |
| 2013/0221978 A1* | 8/2013 | Liao | H05B 45/46 315/192 |
| 2021/0274610 A1* | 9/2021 | Nakayama | H05B 45/34 |

OTHER PUBLICATIONS

Allegro, "Linear Current Regulator and Controller for Automotive LED Arrays," A6274, A6274-1, A6284, A6284-1, Revision 3, MCO-0000881, Jun. 1, 2020, 24 pp.
Infineon, "LITIX Basic," TLD2252-2EP, Revision 1.00, Sep. 26, 2019, 40 pp.

* cited by examiner

*Primary Examiner* — Dedei K Hammond
(74) *Attorney, Agent, or Firm* — Shumaker & Sieffert, P.A.

(57) ABSTRACT

This disclosure includes systems, methods, and techniques for detecting one or more short connections in a plurality of light-emitting diode (LED) channels. For example, a circuit includes processing circuitry configured to control a plurality of driving devices in order to cause a pair of LED channels of the plurality of LED channels to operate in a first state during a first period of time and operate in a second state during a second period of time. Additionally, the processing circuitry is configured to compare a first electrical signal corresponding to the first state of the pair of LED channels and a second electrical signal corresponding to the second state of the pair of LED channels and determine, based on the comparison of the first electrical signal and the second electrical signal, if a short connection exists between the pair of LED channels.

22 Claims, 12 Drawing Sheets

DETECTING SHORT CONNECTIONS IN A PLURALITY OF LED CHANNELS

TECHNICAL FIELD

This disclosure relates circuits for driving, controlling, and monitoring light-emitting diodes.

BACKGROUND

Driver circuits are often used to control a voltage, current, or power at a load. For instance, a light-emitting diode (LED) driver may control the power supplied to a string of light-emitting diodes. In some cases, LED driver circuits may accept an input signal including an input current and an input voltage and deliver an output signal including an output current and an output voltage. In some such cases, an LED driver circuit may regulate at least some aspects of the input signal and the output signal, such as controlling the output current emitted by the LED driver circuit. In some examples, processing circuitry may control one or more driver circuits in order to control a set of LEDs, and monitor one or more parameters associated with the set of LEDs

SUMMARY

In general, this disclosure is directed to devices, systems, and techniques for detecting one or more short connections in a plurality of light-emitting diode (LED) channels. For example, short detection circuitry may be configured to determine whether a pair of LED channels of the plurality of LED channels are electrically connected by a short connection. The short detection circuitry may detect the short connection by performing two or more parameter measurements including a first parameter measurement when the pair of LED channels are operating in a first state and a second parameter measurement when the pair of LED channels are operating in a second state. Each LED channel of the plurality of LED channels may be controlled by a respective LED driver circuit of a plurality of LED driver circuits. To detect whether a short connection links the pair of LED channels, the short detection circuitry may control the respective LED driver circuits corresponding to the pair of LED channels in order to control the pair of LED channels to operate in the first state when the short detection circuitry performs the first parameter measurement and control the pair of LED channels to operate in the second state when the short detection circuitry performs the second parameter measurement.

Circuitry may, in some cases, control a gate driver circuit of the plurality of gate driver circuits in order to control whether a respective LED channel of the plurality of LED channels is turned on or turned off. In some examples, the circuitry may cause each LED channel of the plurality of LED channels according to a duty cycle. As described herein, a "state" of a pair of LED channels may depend on whether a first LED channel of the pair of LED channels is turned on or turned off and whether a second LED channel of the pair of LED channels is turned on or turned off. Since the circuitry may control an LED channel to turn on and turn off according to a duty cycle, the short detection circuitry may wait until a pair of LEDs.

In some examples, a circuit for detecting one or more short connections in a plurality of LED channels includes processing circuitry configured to control a plurality of driving devices in order to cause a pair of LED channels of the plurality of LED channels to operate in a first state during a first period of time and operate in a second state during a second period of time. Additionally, the processing circuitry is configured to compare a first electrical signal corresponding to the first state of the pair of LED channels and a second electrical signal corresponding to the second state of the pair of LED channels; and determine, based on the comparison of the first electrical signal and the second electrical signal, if a short connection exists between the pair of LED channels.

In some examples, a method for detecting one or more short connections in a plurality of LED channels, wherein the method includes controlling, by processing circuitry, a plurality of driving devices in order to cause a pair of LED channels of the plurality of LED channels to operate in a first state during a first period of time and operate in a second state during a second period of time. Additionally, the method includes comparing, by the processing circuitry, a first electrical signal corresponding to the first state of the pair of LED channels and a second electrical signal corresponding to the second state of the pair of LED channels; and determining, by the processing circuitry based on the comparison of the first electrical signal and the second electrical signal, if a short connection exists between the pair of LED channels.

In some examples, a system includes a plurality of LED channels; and a circuit for detecting one or more short connections in the plurality of LED channels. The circuit comprises processing circuitry configured to control a plurality of driving devices in order to cause a pair of LED channels of the plurality of LED channels to operate in a first state during a first period of time and operate in a second state during a second period of time. Additionally, the processing circuitry is configured to compare a first electrical signal corresponding to the first state of the pair of LED channels and a second electrical signal corresponding to the second state of the pair of LED channels and determine, based on the comparison of the first electrical signal and the second electrical signal, if a short connection exists between the pair of LED channels.

The summary is intended to provide an overview of the subject matter described in this disclosure. It is not intended to provide an exclusive or exhaustive explanation of the systems, devices, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters denote like elements throughout the description and figures.

DETAILED DESCRIPTION

A system configured to detect one or more short detections may control a plurality of driving devices, where each driving device of the plurality of driving devices controls whether a respective light emitting diode (LED) channel of a plurality of LED channels receives an electrical signal from a power source. In some examples, circuitry of the system may control the plurality of LED channels in order to perform one or more short detection measurements. For example, to perform a short detection measurement, the system may control a pair of LED channels of the plurality of LED channels in order to determine whether a short connection links the pair of LED channels. The circuitry may compare one or more parameters corresponding to the pair of LED channels while the pair of LED channels operate in a first state with one or more parameters corresponding to the pair of LED channels while the pair of LED channels operate in a second state. Based on this comparison, the circuitry may determine whether the pair of LED channels are linked by a short connection. In some examples, the system may perform a test of each pair of adjacent LED channels of the plurality of LED channels while the plurality of LED channels undergoes normal operation.

Figure 1:
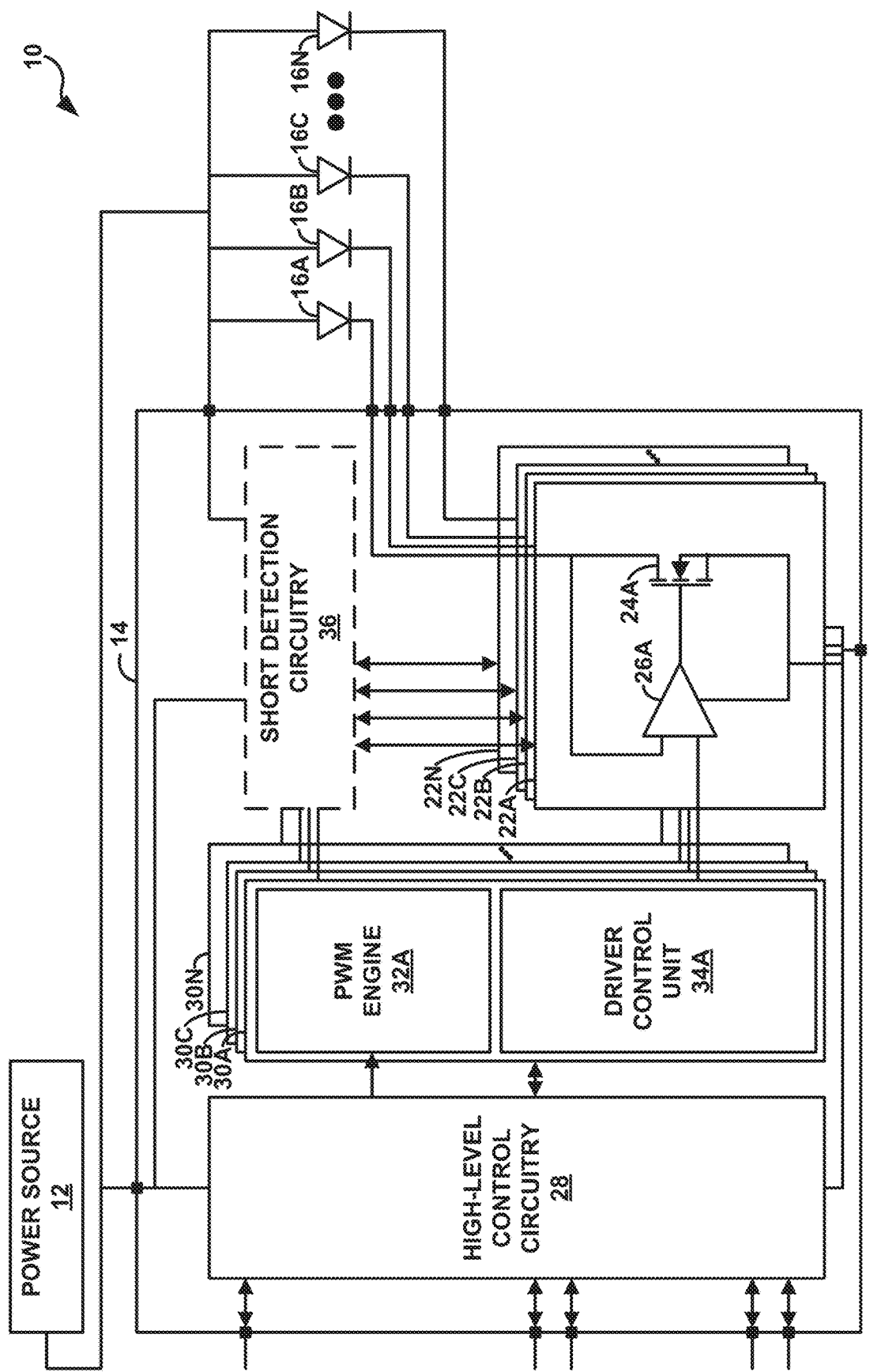
FIG. 1 is a block diagram illustrating a system for detecting one or more short connections in a plurality of light-emitting diode (LED) channels, in accordance with one or more techniques of this disclosure.
Figure 2A:
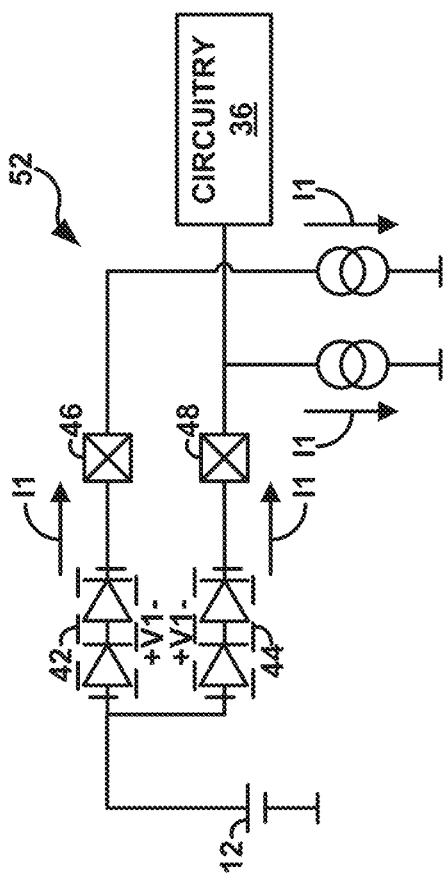
FIGS. 2A-2D are circuit diagrams illustrating short detection circuitry performing a first example short detection test for a pair of LED channels including a first LED channel and a second LED channel, in accordance with one or more techniques of this disclosure.
Figure 2B:
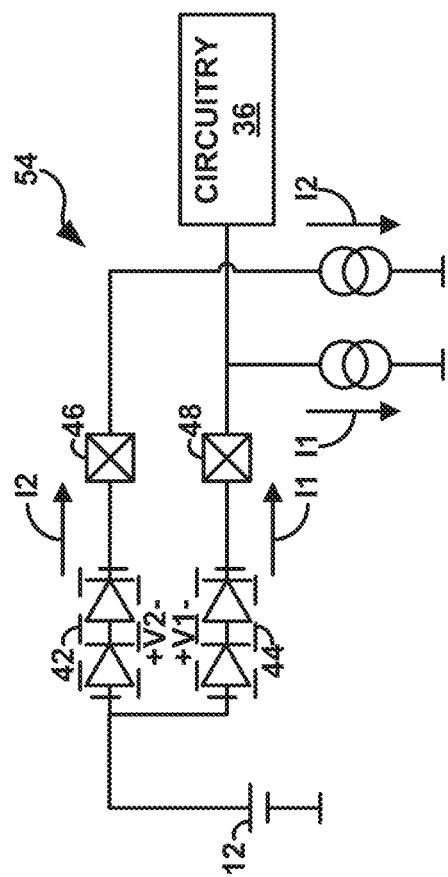
Figure 2C:
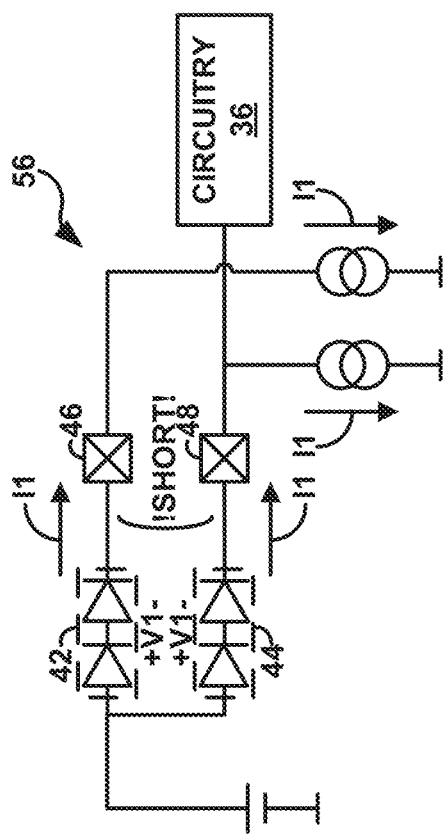
Figure 2D:
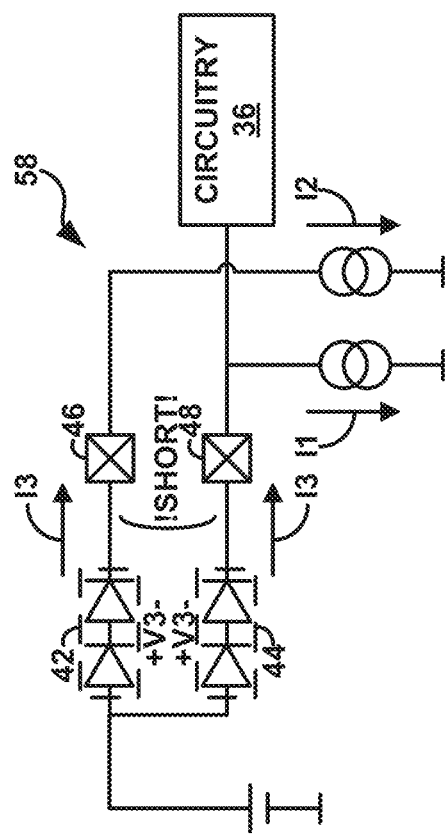
Figure 2E:
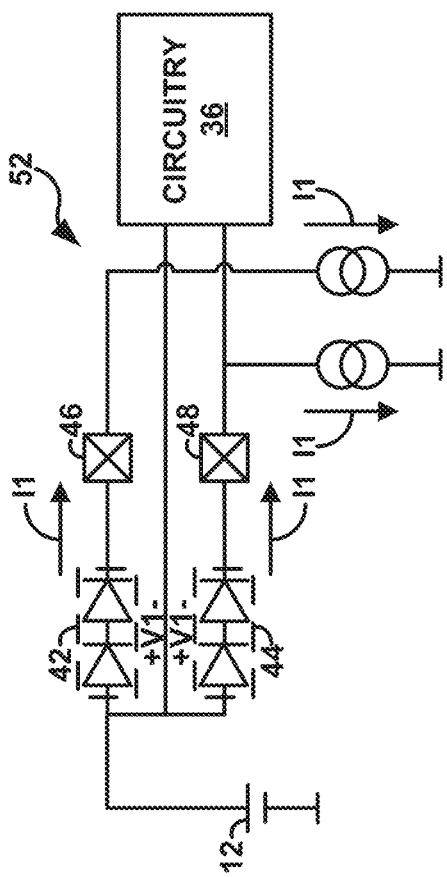
FIGS. 2E-2H are circuit diagrams illustrating short detection circuitry performing a second example short detection test for a pair of LED channels including a first LED channel and a second LED channel, in accordance with one or more techniques of this disclosure.
Figure 2F:
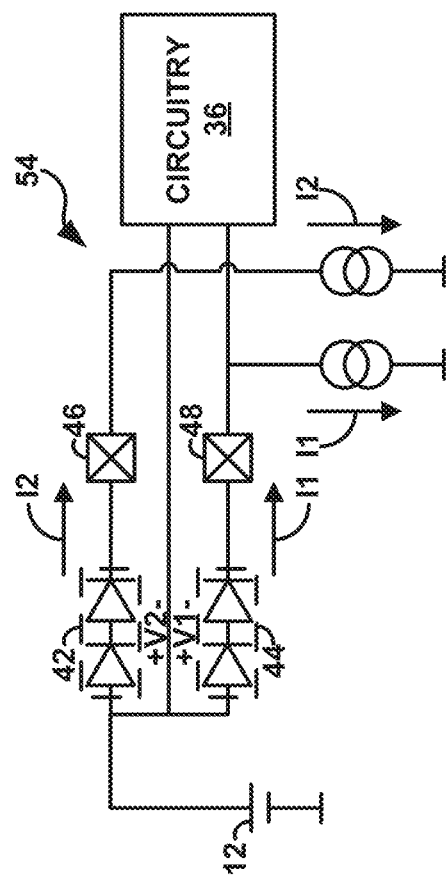
Figure 2G:
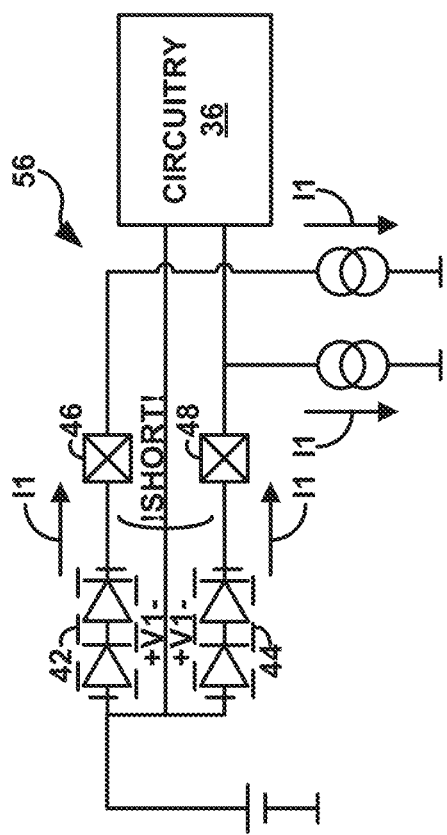
Figure 2H:
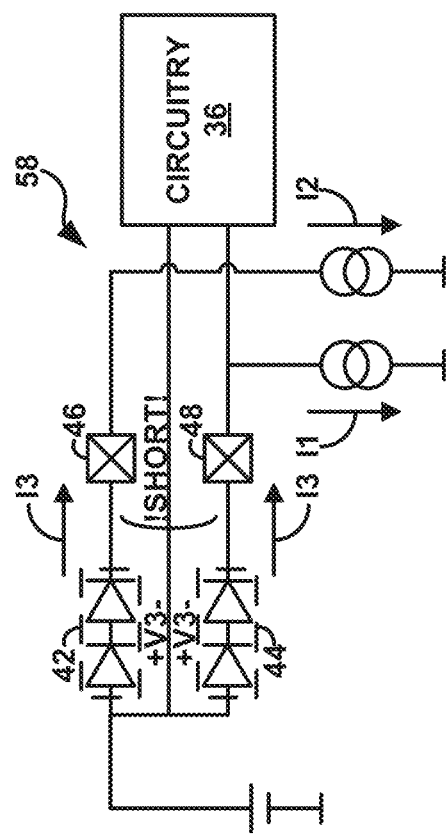
Figure 3A:
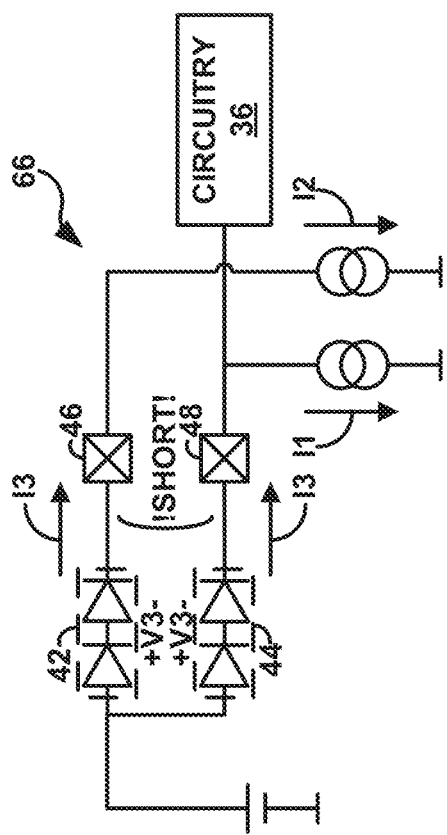
FIGS. 3A-3D are circuit diagrams illustrating short detection circuitry performing a third example short detection test for a pair of LED channels including a first LED channel and a second LED channel, in accordance with one or more techniques of this disclosure.
Figure 3B:
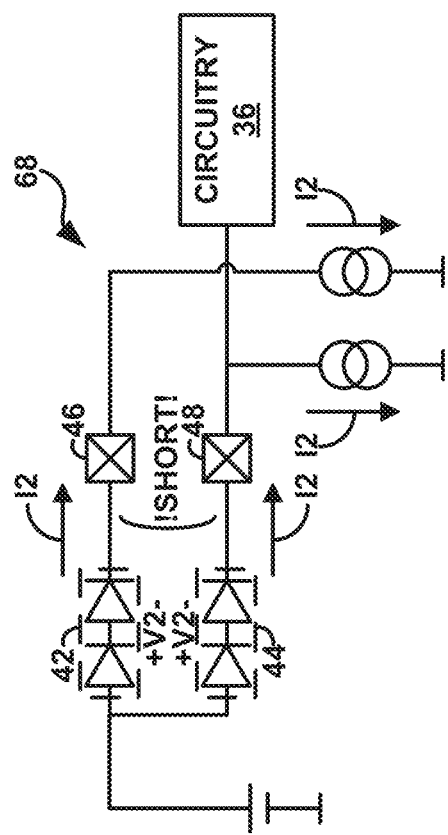
Figure 3C:
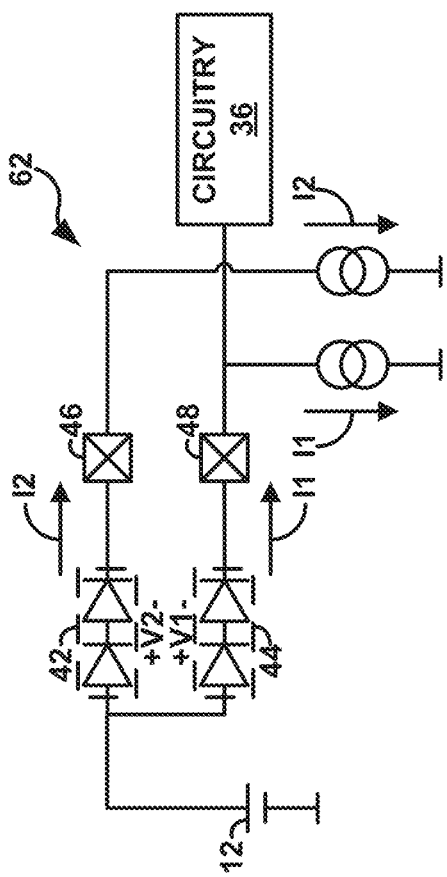
Figure 3D:
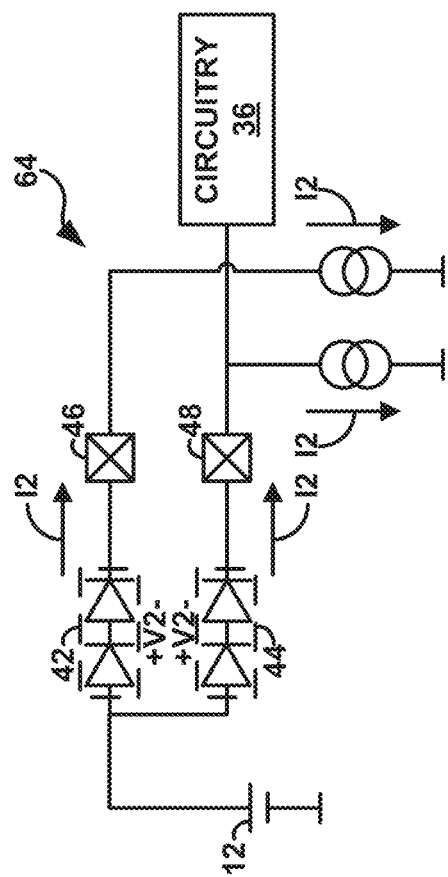
Figure 3E:
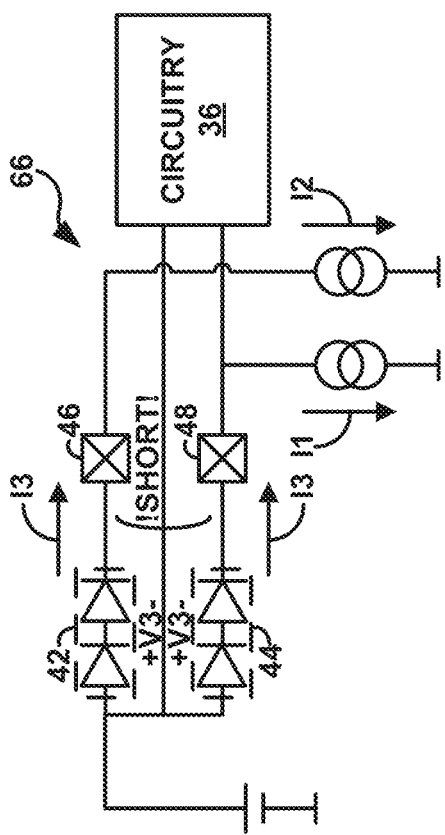
FIGS. 3E-3H are circuit diagrams illustrating short detection circuitry performing a fourth example short detection test for a pair of LED channels including a first LED channel and a second LED channel, in accordance with one or more techniques of this disclosure.
Figure 3F:
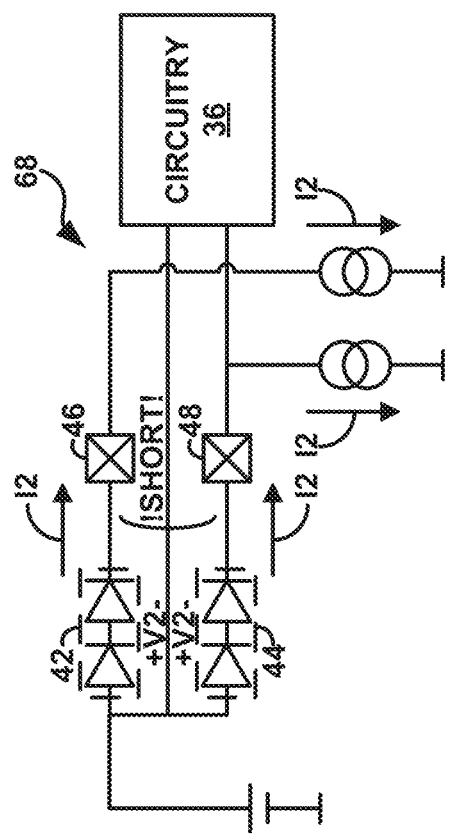
Figure 3G:
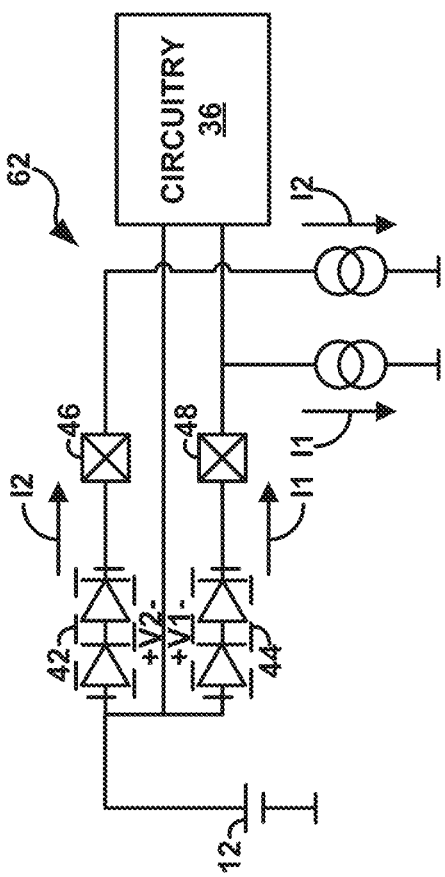
Figure 3H:
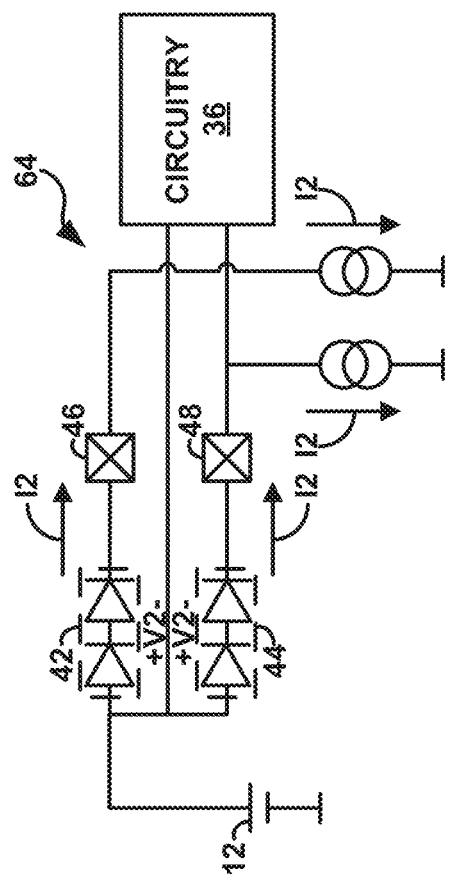

FIG. 1 is a block diagram illustrating a system 10 for detecting one or more short connections in a plurality of LED channels 16, in accordance with one or more techniques of this disclosure. As illustrated in the example of FIG. 1, system 10 includes power source 12, circuit 14, and the plurality of LED channels 16. Circuit 14 includes a plurality of driver circuits 22A-22N (collectively, "driver circuits 22"), high-level control circuitry 28, a plurality of driver control units 30A-30N (collectively, "driver control units 30"), and short detection circuitry 36. Each driver circuit of driver circuits 22 includes a respective driving device of a plurality of driving devices and a respective amplifier of a plurality of amplifiers. For example, driver circuit 22A includes driving device 24A and amplifier 26A. The respective driving device and the respective amplifier corresponding to each driver circuit of driver circuits 22B-22N are arranged in a configuration similar to the configuration of driving device 24A and amplifier 26A. Each driver control unit of driver control units 30 include a respective pulse wave modulation (PWM) engine of a plurality of PWM engines and a driver control unit of a plurality of driver control units. For example, driver control unit 30A includes PWM engine 32A and driver control unit 34A.

System 10 represents a system for controlling the plurality of LED channels 16 to operate according to a lighting scheme. For example, the lighting scheme may determine whether each LED channel of the plurality of LED channels 16 is turned on or turned off and control a duty cycle of each LED channel of the plurality of LED channels 16. System 10 may identify one or more short connections in the plurality of LED channels 16 while the plurality of LED channels 16 are operating according to the lighting scheme. In some examples, system identifies the one or more short connections without making changes to the lighting scheme, but this is not required. Circuit 14 may make one or more changes to the operation of LED channels 16 in order to identify the one or more short connections.

Power source 12 is configured to deliver operating power to circuit 14 and supply power to the plurality of LED channels 16. In some examples, power source 12 includes a battery and a 12 generation circuit to produce operating power. In some examples, power source 12 is rechargeable to allow extended operation. Power source 12 may include any one or more of a plurality of different battery types, such as nickel cadmium batteries and lithium ion batteries. In some examples, a maximum voltage output of power source 12 is approximately 12V. In some examples, power source 12 supplies power within a range from 10 Watts (W) to 15 W. In some examples, power source 12 represents a source other than a battery.

As discussed above, circuit 14 includes driver circuits 22, high-level control circuitry 28, driver control units 30, and short detection circuitry 36. In some examples, any one or combination of high-level control circuitry 28, driver control units 30, and short detection circuitry 36 may represent "processing circuitry" including one or more processors that are configured to implement functionality and/or process instructions for execution within system 10. For example, the processing circuitry may be capable of processing instructions stored a memory (not illustrated in FIG. 1). The processing circuitry may include, for example, microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, the processing circuitry may include any suitable structure, whether in hardware, software, firmware, or any combination thereof, to perform the functions ascribed herein to system 10.

In some examples, the memory in communication with the processing circuitry includes computer-readable instructions that, when executed by the processing circuitry, cause system 10 to perform various functions attributed to system 10 herein. The memory may include any volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital media.

Each driver circuit of driver circuits 22 is configured to control whether a respective LED channel of LED channels 16 is turned on or turned off. That is, driver circuit 22A controls LED channel 16A, driver circuit 22B controls LED channel 16B, and so on. This means that processing circuitry (e.g., high-level control circuitry 28, driver control units 30, short detection circuitry 36, or any combination thereof) may be configured to control driver circuits 22 in order to independently control whether each LED channel of LED channels 16 is turned on or turned off. However, short connections in the plurality of LED channels 16 may affect a manner in which the processing circuitry controls the plurality of LED channels 16. In this way, it may be beneficial for system 10 to detect one or more short detections in the plurality of LED channels 16 so that any existing short connections may be repaired or accounted for in the control of LED channels 16. Although system 10 includes driver circuits 22 in a "low-side" configuration where each driver circuit of driver circuits 22 is connected to an output of a respective LED channel of the plurality of LED channels 16, in some cases (not illustrated in FIG. 1), one or more techniques described herein may be performed using a circuit which controls a plurality of driver circuits in a "high-side" configuration in order to control a plurality of LED channels. A driver circuit which is in the high-side configuration may be electrically connected to an input of an LED channel controlled by the driver circuit such that an electrical current may flow from a power source to the LED channel through the driver circuit. A driver circuit which is in the low-side configuration may be electrically connected to an output of an LED channel controlled by the driver circuit such that an electrical current may flow from a power source to the driver circuit through the LED channel.

As seen in FIG. 1, driver circuit 22A includes driving device 24A. Driving device 24A may, in some cases, include a power switch such as, but not limited to, any type of field-effect transistor (FET) including any one or combination of a metal-oxide-semiconductor field-effect transistor (MOSFET), a bipolar junction transistor (BJT), an insulated-gate bipolar transistor (IGBT), a junction field effect transistor (JFET), a high electron mobility transistor (HEMT), or other kinds of elements that use voltage or current for control. Additionally, driving device 24A may include any one or combination of n-type transistors, p-type transistors, and power transistors. In some examples, driving device 24A includes vertical transistors, lateral transistors, and/or horizontal transistors. In some examples, driving device 24A includes other analog devices such as diodes and/or thyristors. In some examples, driving device 24A may operate as a switch and/or operate as an analog device.

In some examples, driving device 24A includes three terminals: two load terminals and a control terminal. When driving device 24A represents a MOSFET, driving device 24A may include a drain terminal, a source terminal, and at least one gate terminal, where the control terminal is a gate terminal. When driving device 24A represents a BJT switch, the control terminal may represent a base terminal. Current may flow between the two load terminals of driving device 24A, based on the voltage at the respective control terminal. Therefore, electrical current may flow across driving device 24A based on control signals delivered to the control terminal of driving device 24A. In one example, if a voltage applied to the control terminal of driving device 24A is greater than or equal to a voltage threshold, driving device 24A may be activated, allowing driving device 24A to conduct electricity. Furthermore, driving device 24A may be deactivated when the voltage applied to the control terminal of driving device 24A is below the threshold voltage, thus preventing driving device 24A from conducting electricity. Processing circuitry (e.g., high-level control circuitry 28, driver control unit 30A, short detection circuitry 36, or any combination thereof) may be configured to control driving device 24A such that driving device 24A is turned on or turned off at a point in time.

Driving device 24A may include various material compounds, such as Silicon, Silicon Carbide, Gallium Nitride, or any other combination of one or more semiconductor materials. In some examples, silicon carbide switches may experience lower switching power losses. Improvements in magnetics and faster switching, such as Gallium Nitride switches, may allow driving device 24A to draw short bursts of current. These higher frequency devices may require control signals (e.g., voltage signals delivered to the control terminal of driving device 24A) to be sent with more precise timing, as compared to lower-frequency devices.

Driver circuit 22A includes amplifier 26A. As seen in FIG. 1, amplifier 26A receives a first input electrical signal from driver control unit 30A and receives a second input electrical signal from LED channel 16A. Amplifier 26A generates, based on the first input electrical signal and the second input electrical signal, an output electrical signal for delivery to a control terminal of driving device 24A. Consequently, the output electrical signal generated by amplifier 26A controls whether driving device 24A is turned on (e.g., "closed") or turned off (e.g., "open"). When the output electrical signal generated by amplifier 26A causes driving device 24A to be turned on, an electrical current may flow from power source 12 through LED channel 16A and across driving device 24A. That is, when driving device 24A is turned on, LED channel 16A is turned on. When the output electrical signal generated by amplifier 26A causes driving device 24A to be turned off, driving device 24A may, in some cases, prevent or attenuate an electrical current flowing through LED channel 16A. That is, when driving device 24A is turned off, LED channel 16A is turned off.

High-level control circuitry 28 and/or driver control units 30 may control driver circuits 22 in order to control whether each LED channel of LED channels 16 is turned on or turned off and control a duty cycle of each LED channel of LED channels 16. For example, Driver control unit 30A includes a PWM engine 32A which receives one or more instructions from high-level control circuitry 28. PWM engine 32A determines, based on the one or more instructions, a duty cycle for LED channel 16A. Based on the duty cycle determined by PWM engine 32A, driver control unit 34A may be configured to control driving element 24A to turn on and turn off according to the duty cycle, thus causing the LED channel 16A to turn on and turn off according to the duty cycle. Each driver control unit 30 of driver control units 30A-30N controls a respective driver circuit of driver circuits 22A-22N. That is, driver control unit 30A controls driver circuit 22A, driver control unit 30B controls driver circuit controls driver circuit 22B, and so on.

For example, driving device 24A may cycle between being turned on and being turned off at a duty cycle and at a frequency. As used herein, the term "duty cycle" refers to a ratio of an amount of time that a driving device is turned on to an amount of time that the driving device is turned off and the term "frequency" refers to a number of switching cycles completed per unit of time. A full switching cycle may include a complete 'on' phase of the driving device and a complete 'off' phase of the driving device. As an example, when driving device 24A cycles between being turned off and being turned on at a frequency of 1 kilohertz (kHz) and at a duty cycle of 0.9, the driving device may perform 1,000 switching cycles per second, where an 'on' phase of the driving device lasts nine times as long as an 'off' phase of the driving device. Driving device 24A may operate according any duty cycle from 0.0 to 1.0. When driving device 24A operates according to a duty cycle of 1.0 (meaning that driving device 24A is continuously turned on), processing circuitry of circuit 14 may control driving device 24A to briefly turn off driving device 24A in order to perform one or more short detection techniques described herein. When driving device 24A operates according to a duty cycle of 0.0 (meaning that driving device 24A is continuously turned off), processing circuitry of circuit 14 may control driving device 24A to briefly turn on driving device 24A in order to perform one or more short detection techniques described herein.

Short detection circuitry 36 may be configured to perform one or more short detection tests in order to identify one or more short connections in the plurality of LED channels. For example, to perform a short detection test on a pair of LED channels including LED channel 16A and LED channel 16B (collectively, "LED channels 16A, 16B"), processing circuitry (e.g., high-level control circuitry 28, driver control units 30, short detection circuitry 36, or any combination thereof) may control a plurality of driving devices in order to LED channels 16A, 16B operate in a first state during a first period of time and operate in a second state during a second period of time. Short detection circuitry 36 may compare a first electrical signal corresponding to the first state of LED channels 16A, 16B and a second electrical signal corresponding to the second state of LED channels 16A, 16B.

For example, the short detection circuitry 36 may receive the first electrical signal while the pair of LED channels 16A, 16B is operating in the first state. Additionally, the short detection circuitry 36 may receive the second electrical signal while the pair of LED channels 16A, 16B is operating in the second state. To compare the first electrical signal and the second electrical signal, the short detection circuitry 36 may determine a difference between the first electrical signal and the second electrical signal. Subsequently, short detection circuitry 36 may determine, based on the comparison of the first electrical signal and the second electrcal signal, if a short connection exists between the pair of LED channels 16A, 16B. To determine if the short connection exists between the pair of LED channels 16A, 16B, the short detection circuitry 36 is configured to compare the difference between the first electrical signal and the second electrical signal with a threshold difference value and determine if the short connection exists based on the comparison of the determined difference and the threshold difference value.

In one example, the first electrical signal received by short detection circuitry 36 represents an output of LED channel 16B while the pair of LED channels 16A, 16B is operating in the first state and the second electrical signal received by short detection circuitry 36 represents an output of LED channel 16B while the pair of LED channels 16A, 16B is operating in the second state. In this way, the first and second electrical signals may represent the direct electrical output of the second LED channel 16B in the pair of LED channels 16A, 16B while the pair of LED channels 16A, 16B is operating in the first state and the second state, respectively. Consequently, in this example, the comparison to the first electrical signal and the second electrical signal represents a comparison of the outputs of LED channel 16B independent of one or more outputs of power source 12. However, this is not required.

In another example, the first electrical signal received by short detection circuitry 36 represents a difference between the output of LED channel 16B and an output of power source 12 which is configured to supply power to the plurality of LED channels 16 while the pair of LED channels 16A, 16B is operating in the first state. Additionally, the second electrical signal received by short detection circuitry 36 represents a difference between the output of LED channel 16B and an output of power source 12 which is configured to supply power to the plurality of LED channels 16 while the pair of LED channels 16A, 16B is operating in the second state. That is, the first and second electrical signals may represent differences between the output of LED channel 16B and the output of power source 12 rather than representing direct outputs of LED channel 16B. When determining if a short connection exists between the pair of LED channels 16A, 16B, it may be beneficial for the first electrical signal and the second electrical signal to represent differences between the output of LED channel 16B and the output of power source 12 so that short detection circuitry 36 does not attribute differences between the first electrical signal and the second electrical signal caused by an unstable power source 12 to a short connection which does not exist.

As described herein, a "state" of a pair of LED channels may be determined by the on/off status of each LED channel of the respective pair of LED channels. In the case of the LED channels 16A, 16B, the state of the pair of LED channels 16A, 16B may operate according to one of four states including a state where LED channel 16A is turned off and LED channel 16B is turned off, a state where LED channel 16A is turned off and LED channel 16B is turned on, a state where LED channel 16A is turned on and LED channel 16B is turned on, and a state where LED channel 16A is turned on and LED channel 16B is turned off. Any respective pair of LED channels of the plurality of LED channel 16 may operate according to one or more of these four states. That is, the pair of LED channels including LED channel 16B and LED channel 16C (collectively, "LED channels 16B, 16C") may operate according to the same four states, e.g., LED channel 16B off and LED channel 16C off, LED channel 16B off and LED channel 16C on, LED channel 16B on and LED channel 16C on, and LED channel 16B on and LED channel 16C off.

In some examples, to determine whether a short connection exists between the pair of LED channels 16A, 16B, the processing circuitry of circuit 14 may control the pair of LED channels 16A, 16B to operate in a first state by controlling LED channel 16A to be turned off and controlling LED channel 16B to be turned off. While the pair of LED channels 16A, 16B is operating in the first state, short detection circuitry 36 may receive the first electrical signal. Subsequently, the processing circuitry of circuit 14 may control the pair of LED channels 16A, 16B to operate in a second state by controlling LED channel 16A to be turned on and controlling LED channel 16B to be turned off. While the pair of LED channels 16A, 16B is operating in the second state, short detection circuitry 36 may receive the second electrical signal. To determine if a short connection exists between the pair of LED channels 16A, 16B, short detection circuitry 36 may determine that the short connection exists when a difference between the first electrical signal and the second electrical signal is greater than the threshold difference value. In some cases, short detection circuitry 36 may determine that a short connection does not exist between the pair of LED channels 16A, 16B when a difference between the first electrical signal and the second electrical signal is not greater than the threshold difference value.

Additionally, or alternatively, to determine whether a short connection exists between the pair of LED channels 16A, 16B, the processing circuitry of circuit 14 may control the pair of LED channels 16A, 16B to operate in a first state by controlling LED channel 16A to be turned on and controlling LED channel 16B to be turned off. While the pair of LED channels 16A, 16B is operating in the first state, short detection circuitry 36 may receive the first electrical signal. Subsequently, the processing circuitry of circuit 14 may control the pair of LED channels 16A, 16B to operate in a second state by controlling LED channel 16A to be turned on and controlling LED channel 16B to be turned on. While the pair of LED channels 16A, 16B is operating in the second state, short detection circuitry 36 may receive the second electrical signal. To determine if a short connection exists between the pair of LED channels 16A, 16B, short detection circuitry 36 may determine that the short connection exists when a difference between the first electrical signal and the second electrical signal is not greater than the threshold difference value. Short detection circuitry 36 may determine that the short connection does not exist when the difference between the first electrical signal and the second electrical signal is greater than the threshold difference value.

In this way, circuit 14 may perform more than one different test in order to determine whether a short connection exists between a pair of LED channels. For example, the first state may represent one of the four possible states of the pair of LED channels 16A, 16B and the second state may represent another one of the four possible states. Short detection circuitry 36 collects the first electrical signal and the second electrical signal in order to determine how, if at all, one or more parameters of the pair of LED channels 16A, 16B change when the state of the pair of LED channels 16A, 16B changes. Thus, the determined response of the pair of LED channels 16A, 16B to the state change reveals whether a short connection is present. In some examples, circuit 14 may test the pair of LED channels 16B, 16C for a short connection after testing the pair of LED channels 16A, 16B for a short connection. In some examples, circuit 14 may use similar techniques to test the pair of LED channels 16B, 16C, but this is not required.

As seen in FIG. 1, the plurality of LED channels 16 are arranged in a sequence. In some examples, short detection circuitry 36 may determine whether a short connection exists between any adjacent pair of LED channels within the plurality of LED channels 16. That is, short detection circuitry 36 may determine whether a short connection exists between LED channel 16A and 16B, short detection circuitry 36 may determine whether a short connection exists between LED channel 16B and 16C, short detection circuitry 36 may determine whether a short connection exists between LED channel 16C and 16D (not illustrated in FIG. 1), and so on. In some examples, short detection circuitry 36 tests each pair of adjacent LED channels within the plurality of LED channels 16, but this is not required. Short detection circuitry 36 may test any one or more pair of adjacent LED channels. Techniques described herein with respect to the pair of adjacent LED channels 16A, 16B may be performed with respect to any adjacent pair of LEDs within the plurality of LED channels 16.

Each LED channel of LEDs channels 16 may include one or more LEDs. LED channels 16 may include any one or more suitable semiconductor light sources. In some examples, an LED of LEDs channels 16 may include a p-n junction configured to emit light when activated. In some examples, LEDs channels 16 may be included in a headlight assembly for automotive applications. For instance, LEDs channels 16 may light a road ahead of a vehicle. As used herein, a vehicle may refer to motorcycles, trucks, boats, golf carts, snowmobiles, heavy machines, or any type of vehicle that uses directional lighting. In some examples, LEDs channels 16 may include a first set of LEDs representing high-beam (HB) LEDs and a second set of LEDs representing (LB) LEDs. In some cases, circuit 14 may activate LB LEDs, activate the HB LEDs, activate both the LB LEDs and the set of HB LEDs, or deactivate both the LB LEDs and the HB LEDs. LEDs channels 16 may include any number of LED channels, and each LED channel may include any number of LEDs. In some examples, LEDs channels 16 may include a number of LED channels within a range from 2 to 1,000 LED channels. In some examples, an LED channel of LED channels 16 may include a number of LEDs within a range from 1 LED to 100 LEDs. In some examples, LEDs channels 16 may include a number of LED channels within a range from 2 LED channels to 32 LED channels. In some examples, an LED channel of LED channels 16 may include a number of LEDs within a range from 1 LED to 50 LEDs.

FIGS. 2A-2D are circuit diagrams illustrating short detection circuitry 36 performing a first example short detection test for a pair of LED channels including a first LED channel 42 and a second LED channel 44, in accordance with one or more techniques of this disclosure. As seen in FIGS. 2A-2D, the first LED channel 42 is connected to a first pin 46 and the second LED channel 44 is electrically connected to a second pin 48. Short detection circuitry 36 is configured to receive one or more electrical signals output from the second LED channel 44, where LED channel 42 and LED channel 44 receive power from power source 12. In some examples, the circuit of FIGS. 2A-2D may be configured to operate according to a first mode 52 and a second mode 54 when a short connection does not link the first LED channel 42 and the second LED channel 44, and the circuit of FIGS. 2A-2D may be configured to operate according to a third mode 56 and a fourth mode 58 when a short connection links the first LED channel 42 and the second LED channel 44. In some examples, the pair of LED channels including a first LED channel 42 and a second LED channel 44 (collectively, "LED channels 42, 44") may be an example of any pair of adjacent LED channels of the plurality of LED channels 16. Although the circuit of FIGS. 2A-2D is illustrated in a configuration where low-side driving devices control the first LED channel 42 and the second LED channel 44, in some cases (not illustrated in FIGS. 2A-2D), one or more techniques described herein may be applied by a circuit which includes driving devices in a high-side configuration.

In some examples, processing circuitry (e.g., any one or combination of high-level control circuitry 28, driver control units 30, short detection circuitry 36 of FIG. 1) may control the pair of LED channels 42, 44 to operate in a first state. In some examples, to control the pair of LED channels 42, 44 to operate in the first state, the processing circuitry controls the first LED channel 42 to be turned off and the processing circuitry controls the second LED channel 44 to be turned off. Short detection circuitry 36 may receive a first electrical signal while the pair of LED channels 42, 44 operate in the first state, where the first electrical signal represents an output of the second LED channel 44. Subsequently, the processing circuitry may control the pair of LED channels 42, 44 to operate in a second state. In some examples, to control the pair of LED channels 42, 44 to operate in the second state, the processing circuitry controls the first LED channel 42 to be turned on and the processing circuitry controls the second LED channel 44 to be turned off. Short detection circuitry 36 may receive a second electrical signal while the pair of LED channels 42, 44 operate in the second state, where the second electrical signal represents an output of the second LED channel 44.

The circuit of FIGS. 2A-2D operates according to a first mode 52 when the processing circuitry controls the first LED channel 42 to be turned off and controls the second LED channel 44 to be turned off (e.g., controls LED channels 42, 44 to operate in a first state) and when no short connection exists between the first LED channel 42 and the second LED channel 44. When operating according to the first mode 52, the current flowing through the first LED channel 42 may represent a first current magnitude (I1) and the current flowing through the second LED channel 44 may represent the first current magnitude (I1). In some examples, I1 may be within a range from 2 microamperes (μA) to 10 μA (e.g., 5 μA). As such, a small nonzero electrical current I1 may flow through the first LED channel 42 and the second LED channel 44 even while the first LED channel 42 and the second LED channel 44 are "turned off." This small nonzero current may be referred to herein as a "leakage current." Additionally, when the circuit operates according to the first mode 52, a voltage across the first LED channel 42 may represent a first voltage magnitude (V1) and the voltage across the second LED channel 44 may represent the first voltage magnitude (V1). In some examples, the first voltage magnitude V1 may be 1.43 Volts (V) for each LED in the respective LED channel, but this is not required. The first voltage magnitude V1 may represent any voltage magnitude.

The circuit of FIGS. 2A-2D operates according to a second mode 54 when the processing circuitry controls the first LED channel 42 to be turned on and controls the second LED channel 44 to be turned off (e.g., controls LED channels 42, 44 to operate in a second state) and when no short connection exists between the first LED channel 42 and the second LED channel 44. The circuit may transition from first mode 52 to second mode 54 when short detection circuitry 36 performs a short detection test on the pair of LED channels 42, 44. When operating according to the second mode 54, the current flowing through the first LED channel 42 may represent a second current magnitude (I2) and the current flowing through the second LED channel 44 may represent the first current magnitude (I1). In some examples, I2 may be within a range from 2 milliamperes (mA) to 1000 mA (e.g., 5 mA). As such, I2 is significantly greater than the leakage current I1. Additionally, when the circuit operates according to the second mode 54, a voltage across the first LED channel 42 may represent a first voltage magnitude (V2) and the voltage across the second LED channel 44 may represent the first voltage magnitude (V1). In some examples, the second voltage magnitude V2 may be 1.74 Volts (V) for each LED in the respective LED channel, but this is not required. The second voltage magnitude V2 may represent any voltage magnitude. In some examples, V2 may be greater than V1.

When no short connection exists between the first LED channel 42 and the second LED channel 44, short detection circuitry 36 may receive a first electrical signal from second LED channel 44 when the first LED channel 42 is turned off and second LED channel 44 is turned off. Short detection circuitry 36 may receive a second electrical signal from second LED channel 44 when the first LED channel 42 is turned on and second LED channel 44 is turned off. Short detection circuitry 36 may compare the first electrical signal and the second electrical signal in order to determine whether the voltage across the second LED channel 44 changes by more than a threshold amount responsive to a change from the first state of LED channels 42, 44 to the second state of LED channels 42, 44. Since the voltage across the second LED channel 44 is the same while the second state of LED channels 42, 44 operate in the first state as the voltage across the second LED channel 44 while the second state of LED channels 42, 44 operate in the second state (both are V1), short detection circuitry 36 may determine that a short detection does not exist between the first LED channel 42 and the second LED channel 44 when the mode of the circuit changes from the first mode 52 to the second mode 54.

When a short connection does exist between the first LED channel 42 and the second LED channel 44, short detection circuitry 36 may detect a change in voltage across second LED channel 44 responsive to LED channels 42, 44 transitioning from the first state, shown in the third mode 56 of the circuit, to the second state, shown in the fourth mode 58 of the circuit. For example, the circuit of FIGS. 2A-2D operates according to the third mode 56 when the processing circuitry controls LED channels 42, 44 to operate in a third state and when a short connection exists between the first LED channel 42 and the second LED channel 44. When operating according to the third mode 56, the current flowing through the first LED channel 42 may represent a first current magnitude (I1) and the current flowing through the second LED channel 44 may represent the leakage current I1. Additionally, when the circuit operates according to the third mode 56, a voltage across the first LED channel 42 may represent the first voltage magnitude (V1) and the voltage across the second LED channel 44 may represent the first voltage magnitude (V1).

The circuit of FIGS. 2A-2D operates according to a fourth mode 58 when the processing circuitry controls LED channels 42, 44 to operate in the second state and when a short connection exists between the first LED channel 42 and the second LED channel 44. When operating according to the fourth mode 58, the current flowing through the first LED channel 42 may represent a third current magnitude (I3) and the current flowing through the second LED channel 44 may represent the third current magnitude (I3). In some examples, I3 may be within a range from 1 mA to 1000 mA (e.g., 2.5 mA). As such, I3 is significantly greater than the leakage current I1 and I3 is less than I2. This may be due to the fact that when first LED channel 42 is turned on and second LED channel 44 is turned off and a short connection links LED channels 42, 44, some of the electrical current meant to flow through first LED channel 42 leaks across the short connection to second LED channel 44 even when second LED channel 44 is "turned off." Additionally, when the circuit operates according to the fourth mode 58, a voltage across the first LED channel 42 may represent a third voltage magnitude (V3) and the voltage across the second LED channel 44 may represent the third voltage magnitude (V3). In some examples, the third voltage magnitude V3 may be 1.71 Volts (V) for each LED in the respective LED channel, but this is not required. The third voltage magnitude V3 may represent any voltage magnitude.

When short detection circuitry 36 compares the first electrical signal to the second electrical signal and determines that the voltage across the second LED channel 44 increases from V1 to V3, short detection circuitry 36 may determine that a short connection exists between the first LED channel 42 and the second LED channel 44. That is, short detection circuitry 36 may determine that a difference between V1 and V3 is greater than a threshold voltage difference, and short detection circuitry 36 may consequently determine that a short connection exists between the first LED channel 42 and the second LED channel 44. As such, mode 52 and mode 54 of FIG. 2A and FIG. 2B, respectively, illustrate a response of the circuit to a transition from LED channels 42, 44 operating according to the first state to operating according to the second state, respectively, when no short connection is present. Mode 56 and mode 58 of FIG. 2C and FIG. 2D, respectively, illustrate a response of the circuit to a transition from LED channels 42, 44 operating according to the first state to operating according to the second state, respectively, when a short connection links the channels.

FIGS. 2E-2H are circuit diagrams illustrating short detection circuitry 36 performing a second example short detection test for a pair of LED channels including a first LED channel 42 and a second LED channel 44, in accordance with one or more techniques of this disclosure. As seen in FIGS. 2E-2H, the first LED channel 42 is electrically connected to a first pin 46 and the second LED channel 44 is electrically connected to a second pin 48. The circuit of FIGS. 2E-2H may be substantially the same as the circuit of FIGS. 2A-2D except that in the circuit of FIGS. 2E-2H, short detection circuitry 36 receives both of an output from power source 12 and an output from the second LED channel 44, whereas in the example of FIGS. 2A-2D, short detection circuitry 36 receives an output from the second LED channel 44 without receiving an output from power source 12. Although the circuit of FIGS. 2E-2H is illustrated in a configuration where low-side driving devices control the first LED channel 42 and the second LED channel 44, in some cases (not illustrated in FIGS. 2E-2H), one or more techniques described herein may be applied by a circuit which includes driving devices in a high-side configuration.

In some examples, processing circuitry (e.g., any one or combination of high-level control circuitry 28, driver control units 30, short detection circuitry 36 of FIG. 1) may control the pair of LED channels 42, 44 to operate in a first state. In some examples, to control the pair of LED channels 42, 44 to operate in the first state, the processing circuitry controls the first LED channel 42 to be turned off and the processing circuitry controls the second LED channel 44 to be turned off. Short detection circuitry 36 may receive a first electrical signal while the pair of LED channels 42, 44 operate in the first state, where the first electrical signal represents a difference between an output of the second LED channel 44 and an output of power source 12. Subsequently, the processing circuitry may control the pair of LED channels 42, 44 to operate in a second state. In some examples, to control the pair of LED channels 42, 44 to operate in the second state, the processing circuitry controls the first LED channel 42 to be turned on and the processing circuitry controls the second LED channel 44 to be turned off. Short detection circuitry 36 may receive a second electrical signal while the pair of LED channels 42, 44 operate in the second state, where the second electrical signal represents a difference between an output of the second LED channel 44 and the output of power source 12.

When the pair of LED channels 42, 44 transition from operating in the first state to operating in the second state, the circuit of FIGS. 2E-2H transitions from operating according to mode 52 to operating according to mode 54 when no short connection is present between the pair of LED channels 42, 44. Alternatively, when a short connection is present between the pair of LED channels 42, 44, the circuit of FIGS. 2E-2H transitions from operating according to mode 56 to operating according to mode 58 when the pair of LED channels 42, 44 transition from operating in the first state to operating in the second state.

Short detection circuitry 36 may determine whether a short connection links the pair of LED channels 42, 44 by comparing the first electrical signal and the second electrical signal. In the example of FIGS. 2E-2H, the first electrical signal represents a difference between a voltage output from power source 12 and a voltage output from the second LED channel 44 when the pair of LED channels 42, 44 are operating in the first state (e.g., first LED channel 42 turned off and second LED channel 44 turned off) and the second electrical signal represents a difference between a voltage output from power source 12 and a voltage output from the second LED channel 44 when the pair of LED channels 42, 44 are operating in the second state (e.g., first LED channel 42 turned on and second LED channel 44 turned off). Short detection circuitry 36 may determine a difference between a first voltage indicated by the first electrical signal and a second voltage indicated by the second electrical signal. When the difference between the first voltage and the second voltage is greater than a threshold voltage difference, thus indicating a transition of the circuit from mode 56 to mode 58, short detection circuitry 36 may determine that a short connection exists between the pair of LED channels 42, 44. When the difference between the first voltage and the second voltage is not greater than the threshold voltage difference, thus indicating a transition of the circuit from mode 52 to mode 54, short detection circuitry 36 may determine that a short connection does not exist between the pair of LED channels 42, 44.

FIGS. 3A-3D are circuit diagrams illustrating short detection circuitry 36 performing a third example short detection test for a pair of LED channels including a first LED channel 42 and a second LED channel 44, in accordance with one or more techniques of this disclosure. As seen in FIGS. 3A-3D, the first LED channel 42 is connected to a first pin 46 and the second LED channel 44 is electrically connected to a second pin 48. Short detection circuitry 36 is configured to receive one or more electrical signals output from the second LED channel 44, where LED channel 42 and LED channel 44 receive power from power source 12. In some examples, the circuit of FIGS. 3A-3D may be configured to operate according to a first mode 62 and a second mode 64 when a short connection does not link the first LED channel 42 and the second LED channel 44, and the circuit of FIGS. 2A-2D may be configured to operate according to a third mode 66 and a fourth mode 68 when a short connection links the first LED channel 42 and the second LED channel 44. In some examples, the pair of LED channels including a first LED channel 42 and a second LED channel 44 (collectively, "LED channels 42, 44") may be an example of any pair of adjacent LED channels of the plurality of LED channels 16. Although the circuit of FIGS. 3A-3D is illustrated in a configuration where low-side driving devices control the first LED channel 42 and the second LED channel 44, in some cases (not illustrated in FIGS. 3A-3D), one or more techniques described herein may be applied by a circuit which includes driving devices in a high-side configuration.

The third example short detection test of FIGS. 3A-3D may be substantially the same as the first example short detection test of circuit of FIGS. 2A-2D, except that the third example short detection test of FIGS. 3A-3D includes a transition of LED channels 42, 44 from a first state in which the first LED channel 42 is turned on and the second LED channel 44 is turned off to a second state in which the first LED channel 42 is turned on and the second LED channel 44 is turned on, whereas the first example short detection test of FIGS. 2A-2D includes a transition of LED channels 42, 44 from a first state in which the first LED channel 42 is turned off and the second LED channel 44 is turned off to a second state in which the first LED channel 42 is turned on and the second LED channel 44 is turned off.

For example, the short detection circuitry 36 may perform the third example short detection test by comparing the first electrical signal with the second electrical signal, where the first electrical signal represents an output of the second LED channel 44 while the first LED channel 42 is on and the second LED channel 44 is off, and the second electrical signal represents an output of the second LED channel 44 while the first LED channel 42 is on and the second LED channel 44 is on. The short detection circuitry 36 may determine a difference between a voltage of the first electrical signal and a voltage of the second electrical signal.

When the difference between the voltage of the first electrical signal and the voltage of the second electrical signal is greater than a threshold voltage difference, the short detection circuitry 36 may determine that a short connection does not exist between LED channels 42, 44. This is because when the second LED channel 44 transitions from being turned off to being turned on, it is expected that a voltage output from second LED channel 44 will increase by at least the voltage difference threshold when no short connection is present. For example, in the transition of the circuit from mode 62 to mode 64, the voltage output from the second LED channel 44 changes from V1 in mode 62 to V2 in mode 64. The difference between V1 and V2 is, in some cases, greater than the voltage difference threshold.

Alternatively, when the difference between the voltage of the first electrical signal and the voltage of the second electrical signal is not greater than the threshold voltage difference, the short detection circuitry 36 may determine that a short connection exists between LED channels 42, 44. This is because when the second LED channel 44 transitions from being turned off to being turned on, a portion of the current flowing through the second LED channel 44 may leak to the first LED channel 42 through the short connection if a short connection is present, thus attenuating a change in the voltage output from the second LED channel 44 when the LED channel 44 turns on. For example, in the transition of the circuit from mode 66 to mode 68, the voltage output from the second LED channel 44 changes from V1 in mode 66 to V3 in mode 68. The difference between V1 and V3 is, in some cases, not greater than the voltage difference threshold, indicating that a short connection is present between LED channels 42, 44.

FIGS. 3E-3H are circuit diagrams illustrating short detection circuitry 36 performing a fourth example short detection test for a pair of LED channels including a first LED channel 42 and a second LED channel 44, in accordance with one or more techniques of this disclosure. As seen in FIGS. 3E-3H, the first LED channel 42 is electrically connected to a first pin 46 and the second LED channel 44 is electrically connected to a second pin 48. The circuit of FIGS. 3E-3H may be substantially the same as the circuit of FIGS. 3A-3D except that in the circuit of FIGS. 3E-3H, short detection circuitry 36 receives both of an output from power source 12 and an output from the second LED channel 44, whereas in the example of FIGS. 3A-3D, short detection circuitry 36 receives an output from the second LED channel 44 without receiving an output from power source 12. Although the circuit of FIGS. 3E-3H is illustrated in a configuration where low-side driving devices control the first LED channel 42 and the second LED channel 44, in some cases (not illustrated in FIGS. 3E-3H), one or more techniques described herein may be applied by a circuit which includes driving devices in a high-side configuration.

The fourth example short detection test of FIGS. 3E-3H includes a transition of LED channels 42, 44 from a first state in which the first LED channel 42 is turned on and the second LED channel 44 is turned off to a second state in which the first LED channel 42 is turned on and the second LED channel 44 is turned on. For example, the short detection circuitry 36 may perform the fourth example short detection test by comparing the a first electrical signal with a second electrical signal. The first electrical signal represents a difference between an output of the second LED channel 44 and an output of power source 12 while the first LED channel 42 is on and the second LED channel 44 is off. The second electrical signal represents a difference between an output of the second LED channel 44 and an output of power source 12 while the first LED channel 42 is on and the second LED channel 44 is on. The short detection circuitry 36 may determine a difference between a voltage of the first electrical signal and a voltage of the second electrical signal.

When the difference between the voltage of the first electrical signal and the voltage of the second electrical signal is greater than a threshold voltage difference, the short detection circuitry 36 may determine that a short connection does not exist between LED channels 42, 44. This is because when the second LED channel 44 transitions from being turned off to being turned on, it is expected that a difference between the voltage output from second LED channel 44 and the voltage output from power source 12 will increase by at least the voltage difference threshold when no short connection is present. For example, in the transition of the circuit from mode 62 to mode 64, the voltage output from the second LED channel 44 changes from V1 in mode 62 to V2 in mode 64. The difference between V1 and V2 is, in some cases, greater than the voltage difference threshold.

Alternatively, when the difference between the voltage of the first electrical signal and the voltage of the second electrical signal is not greater than the threshold voltage difference, the short detection circuitry 36 may determine that a short connection exists between LED channels 42, 44. This is because when the second LED channel 44 transitions from being turned off to being turned on, a portion of the current flowing through the second LED channel 44 may leak to the first LED channel 42 through the short connection if a short connection is present, thus attenuating a change in the difference between the voltage output from the second LED channel 44 and the voltage output from power source 12 when the LED channel 44 turns on. For example, in the transition of the circuit from mode 66 to mode 68, the difference between the voltage output from the second LED channel 44 and the voltage output from power source 12 changes from V1 in mode 66 to V3 in mode 68. The difference between V1 and V3 is, in some cases, not greater than the voltage difference threshold, indicating that a short connection is present between LED channels 42, 44.

Figure 4A:
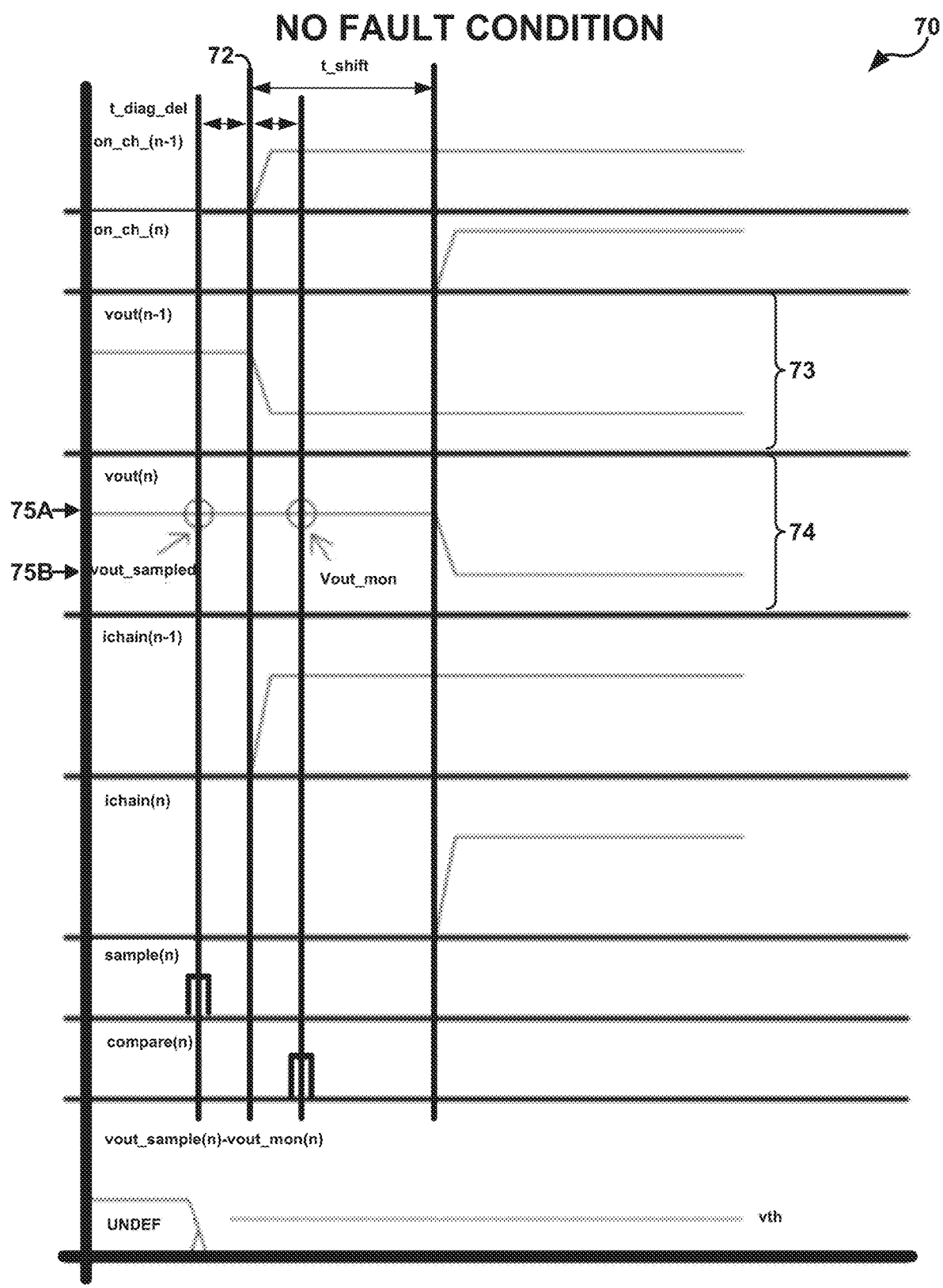
FIG. 4A is a graph illustrating a first plot of a plurality of parameters corresponding to a pair of LED channels while no short connection is present, in accordance with one or more techniques of this disclosure.

FIG. 4A is a graph illustrating a first plot 70 of a plurality of parameters corresponding to a pair of LED channels while no short connection is present, in accordance with one or more techniques of this disclosure. The pair of LED channels may represent any pair of LED channels of the plurality of LED channels 16 of FIG. 1. Time 72 indicates a point in plot 70 in which the pair of LED channels transition from a first state to a second state while no short connection is present between the pair of LED channels. In some examples, the first plot 70 of FIG. 4A corresponds to the circuit operation of FIGS. 2A-2B, where no short connection is present between the first LED channel 42 and the second LED channel 44.

Plot 70 includes a voltage output 73 of a first LED channel of the pair of LED channels and a voltage output 74 of a second LED channel of the pair of LED channels. As seen in FIG. 4, the voltage output 74 of the second LED channel remains at a first voltage level 75A when the pair of LED channels transition from the first state to the second state at time 72. In the example of FIG. 4, the first state represents a state in which the first LED channel is off and the second LED channel is off and the second state represents a state in which the first LED channel is on and the second LED is off. In the transition of the pair of LED channels from the first state to the second state, the second LED channel remains turned off. This means that a voltage output of the second LED channel is expected to remain constant in the transition from the first state to the second state when no short connection exists between the first LED channel and the second LED channel. Consequently, voltage output 74 of the second LED channel, as shown in plot 70, indicates that no short connection exists between the pair of LED channels.

Figure 4B:
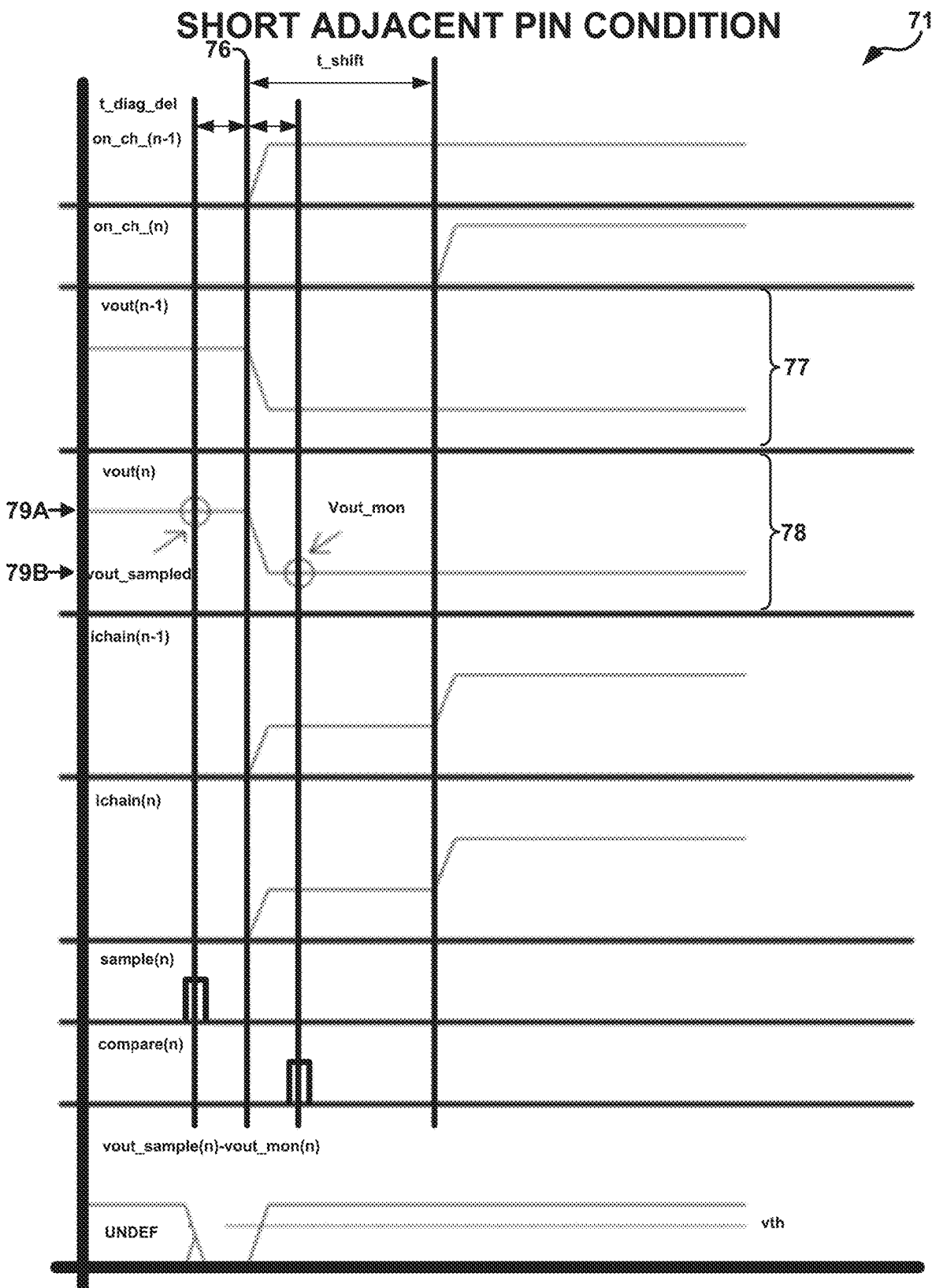
FIG. 4B is a graph illustrating a second plot of a plurality of parameters corresponding to a pair of LED channels while a short connection is present, in accordance with one or more techniques of this disclosure.

FIG. 4B is a graph illustrating a second plot 71 of a plurality of parameters corresponding to a pair of LED channels while a short connection is present, in accordance with one or more techniques of this disclosure. The pair of LED channels may represent the pair of LED channels of the plurality of LED channels 16 corresponding to plot 70 of FIG. 4A. Time 76 indicates a point in plot 71 in which the pair of LED channels transition from a first state to a second state while a short connection is present between the pair of LED channels. In some examples, the first plot 71 of FIG. 4B corresponds to the circuit operation of FIGS. 2C-2D, where a short connection is present between the first LED channel 42 and the second LED channel 44.

Plot 71 includes a voltage output 77 of the first LED channel of the pair of LED channels and a voltage output 74 of the second LED channel of the pair of LED channels. As seen in plot 71, the voltage output 78 of the second LED channel transitions from a first voltage level 79A to a second voltage level 77B when the pair of LED channels transition from the first state to the second state at time 76. In the example of FIG. 4, the first state represents a state in which the first LED channel is off and the second LED channel is off and the second state represents a state in which the first LED channel is on and the second LED is off. In the transition of the pair of LED channels from the first state to the second state, the second LED channel remains turned off while the first LED channel transitions from being turned off to being turned on. This means that a voltage output of the second LED channel is expected change in the transition from the first state to the second state when a short connection exists between the first LED channel and the second LED channel, since a portion of the current flowing through the first LED channel leaks across the short connection to the second LED channel. Consequently, voltage output 78 of the second LED channel, as shown in plot 71, indicates that a short connection exists between the pair of LED channels, since the transition of the voltage output 78 from the first voltage level 79A to the second voltage level 79B is greater than a voltage difference threshold.

Figure 5A:
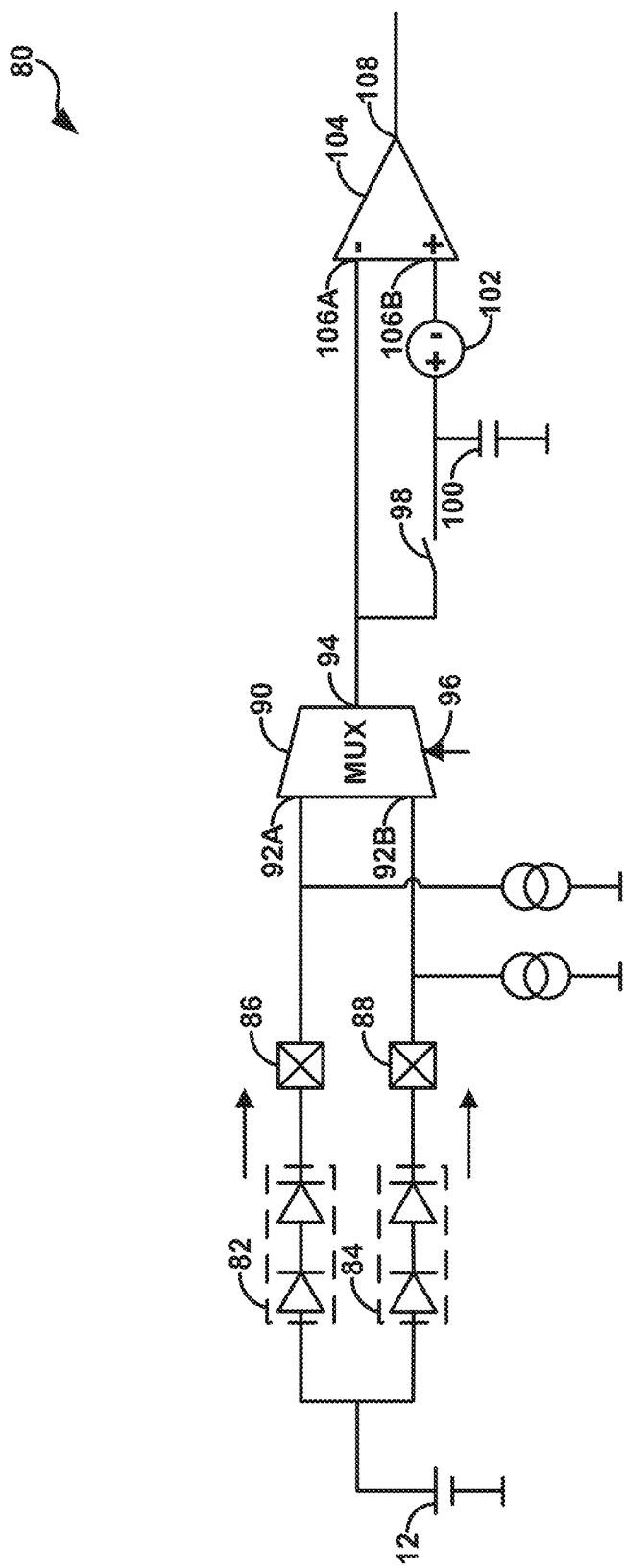
FIG. 5A is a circuit diagram illustrating a first example circuit which includes a first LED channel, a second LED channel, and analog circuitry for outputting information indicating whether a short connection exists between the first LED channel and the second LED channel, in accordance with one or more techniques of this disclosure.

FIG. 5A is a circuit diagram illustrating a first example circuit 80 which includes a first LED channel 82, a second LED channel 84, and analog circuitry for outputting information indicating whether a short connection exists between the first LED channel 82 and the second LED channel 84, in accordance with one or more techniques of this disclosure. As seen in FIG. 5A, the first LED channel 82 is connected to a first pin 86 and the second LED channel 84 is electrically connected to a second pin 88. The first LED channel 82 and the second LED channel 84 may receive power from power source 12. Multiplexer 90, switching device 98, capacitor 100, threshold voltage element 102, and amplifier 104 may, in some cases, represent elements of short detection circuitry 36 of FIG. 1.

Multiplexer 90 includes first multiplexer data input 92A and second multiplexer data input 92B (collectively, "multiplexer data inputs 92"). Additionally, multiplexer 90 includes multiplexer data output 94 and multiplexer control input 96. As seen in FIG. 5A, first multiplexer data input 92A is electrically connected to an output of the first LED channel 82 and second multiplexer data input 92B is electrically connected to an output of the second LED channel 84 Multiplexer 90 may control, based on a control signal received at multiplexer control input 96, whether an electrical signal flows across multiplexer 90 from first multiplexer data input 92A to multiplexer data output 94 or whether an electrical signal flows across multiplexer 90 from second multiplexer data input 92B to multiplexer data output 94.

For example, during a test to determine whether a short connection exists between the first LED channel 82 and the second LED channel 84, multiplexer 90 may receive a control signal at multiplexer control input 96 which causes multiplexer 90 to carry an electrical signal from the second multiplexer data input 92B to the multiplexer data output 94. That is, multiplexer 90 carries the electrical signal output from the second LED channel 84 from the second multiplexer data input 92B to the multiplexer data output 94. For example, multiplexer 90 may receive a first electrical signal when the first LED channel 82 and the second LED channel 84 operate in a first state and multiplexer 90 may receive a second electrical signal when the first LED channel 82 and the second LED channel 84 operate in a second state. When multiplexer 90 receives the first electrical signal from the second LED channel 84, switching device 98 may be turned on, causing capacitor 100 to charge. In some cases, capacitor 100 may charge to a voltage level of the first electrical signal. When multiplexer 90 receives the second electrical signal, switching device 98 may be turned off, causing the second electrical signal to travel directly to amplifier 104 without passing through the channel including capacitor 100.

Amplifier 104 includes a first amplifier data input 106A and a second amplifier data input 106B (collectively, "amplifier data inputs 106") and an amplifier data output 108. When multiplexer 90 receives the second electrical signal, the second electrical signal travels from multiplexer data output 94 to the first amplifier data input 106A. Additionally, capacitor 100 discharges, travelling through threshold voltage element 102 to the second amplifier data input 106B.

As discussed above, capacitor 100 charges to a voltage value of the first electrical signal when switching device 98 is activated and when multiplexer 90 receives the first electrical signal. When capacitor 100 discharges, capacitor 100 emits an electrical signal which includes the voltage of the first electrical signal. The electrical signal emitted by capacitor 100 passes through threshold voltage element 102, thus generating a third electrical signal which has a voltage equal to a sum of the voltage of the first electrical signal and a voltage of the threshold voltage element 102. First amplifier data input 106A receives the second electrical signal and second amplifier data input 106B receives the third electrical signal. Amplifier 104 may generate an amplifier signal which indicates whether a voltage of the third electrical signal is greater than a voltage of the second electrical signal.

Since the voltage of the third electrical signal represents a sum of a voltage of the first electrical signal and a threshold voltage difference value, amplifier 104 may output the amplifier signal via amplifier data output 108, where the amplifier signal indicates whether a difference between a voltage of the first electrical signal and a voltage of the second electrical signal is greater than the threshold voltage difference value. Processing circuitry may determine whether a short connection exists between the first LED channel 82 and the second LED channel 84 based on the amplifier signal, which indicates whether the difference is greater than the threshold voltage difference value.

Figure 5B:
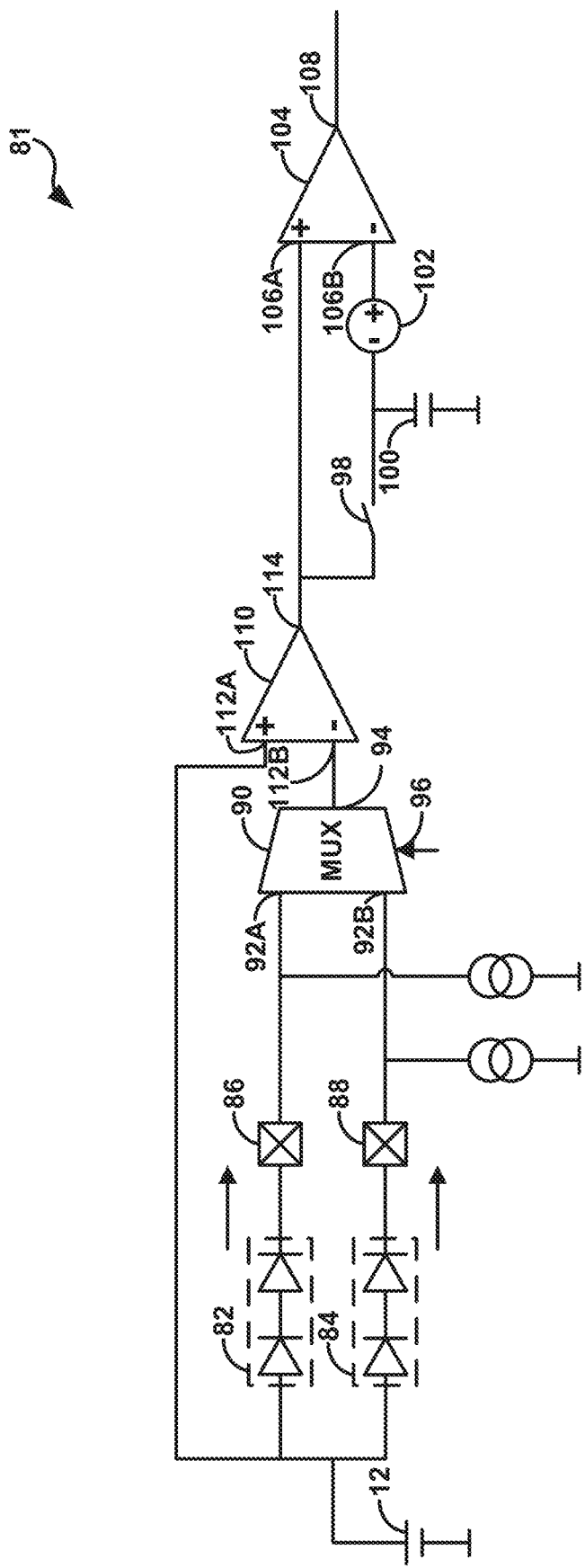
FIG. 5B is a circuit diagram illustrating a second example circuit which includes a first LED channel, a second LED channel, and analog circuitry for outputting information indicating whether a short connection exists between the first LED channel and the second LED channel, in accordance with one or more techniques of this disclosure.

FIG. 5B is a circuit diagram illustrating a second example circuit 81 which includes a first LED channel 82, a second LED channel 84, and analog circuitry for outputting information indicating whether a short connection exists between the first LED channel 82 and the second LED channel 84, in accordance with one or more techniques of this disclosure. As seen in FIG. 5A, the first LED channel 82 is connected to a first pin 86 and the second LED channel 84 is electrically connected to a second pin 88. The first LED channel 82 and the second LED channel 84 may receive power from power source 12. Multiplexer 90, switching device 98, capacitor 100, threshold voltage element 102, amplifier 104, and amplifier 110 may, in some cases, represent elements of short detection circuitry 36 of FIG. 1.

Circuit 81 of FIG. 5B may be substantially the same as the circuit 80 of FIG. 5A, except that circuit 81 includes an amplifier 110 which receives an electrical signal output from power source 12 and an electrical signal output from multiplexer 90. For example, amplifier 110 includes a first amplifier data input 112A and a second amplifier data input 112B (collectively, "amplifier data inputs 112") and an amplifier data output 114. Amplifier 110 receives an output from power source 12 at first amplifier data input 112A and amplifier 110 receives an output from multiplexer 90 at second amplifier data input 112B. Amplifier 110 may generate an amplifier signal which represents a difference between the signal received at first amplifier data input 112A and the signal received at second amplifier data input 112B.

Circuit 81 may operate substantially the same as circuit 80 of FIG. 5A except that a first electrical signal generated by amplifier 110 of circuit 81 represents a difference between a voltage of the electrical signal output by power source 12 and a voltage of an electrical signal output by second LED channel 84 while the first LED channel 82 and the second LED channel 84 operate in a first state, and a second electrical signal generated by amplifier 110 of circuit 81 represents a difference between a voltage of the electrical signal output by power source 12 and a voltage of an electrical signal output by second LED channel 84 while the first LED channel 82 and the second LED channel 84 operate in a second state. By generating the first electrical signal and the second electrical signal to account for the output of power source 12, amplifier 110 may prevent circuit 81 from erroneously indicating that a short connection exists due to fluctuations in power output by the power source 12.

Figure 6A:
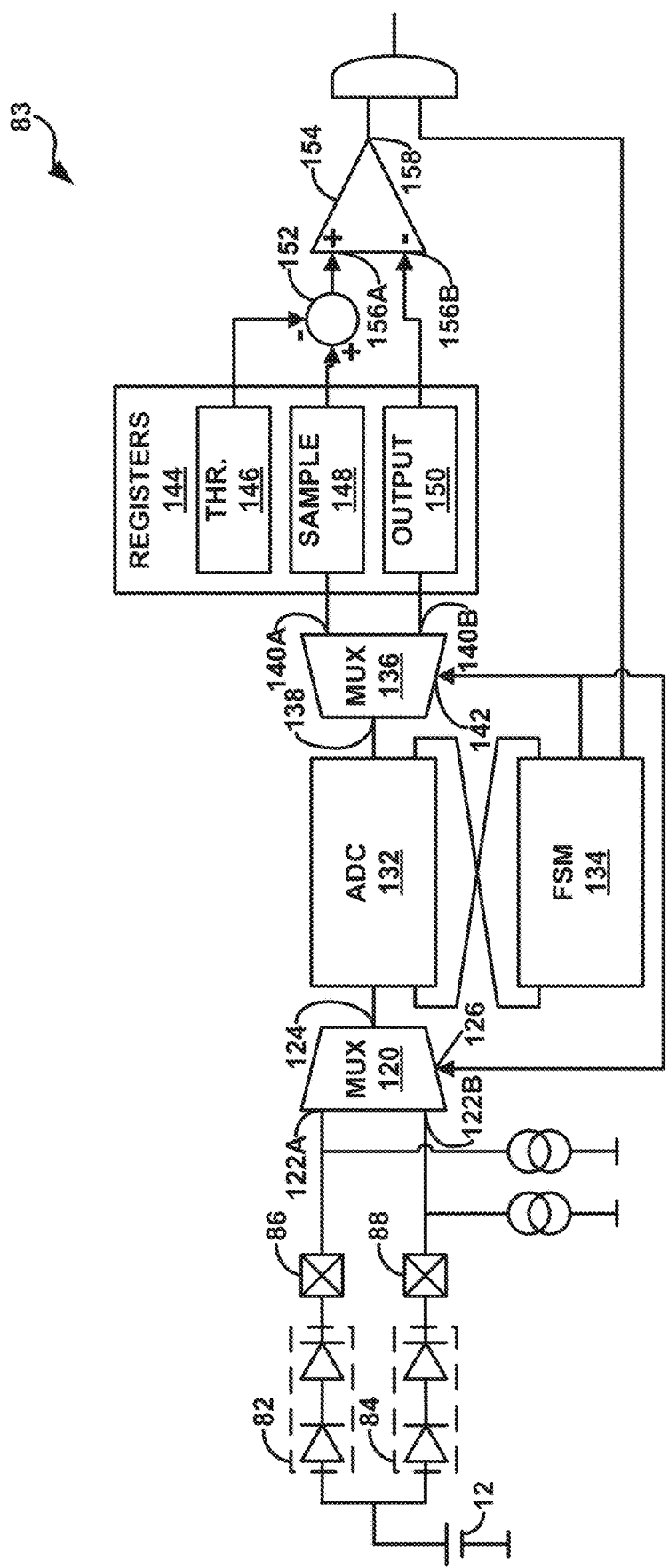
FIG. 6A is a circuit diagram illustrating a third example circuit which includes a first LED channel, a second LED channel, and analog and digital circuitry for outputting information indicating whether a short connection exists between the first LED channel and the second LED channel, in accordance with one or more techniques of this disclosure.

FIG. 6A is a circuit diagram illustrating a third example circuit 83 which includes a first LED channel 82, a second LED channel 84, and analog and digital circuitry for outputting information indicating whether a short connection exists between the first LED channel 82 and the second LED channel 84, in accordance with one or more techniques of this disclosure. As seen in FIG. 6A, the first LED channel 82 is connected to a first pin 86 and the second LED channel 84 is electrically connected to a second pin 88. The first LED channel 82 and the second LED channel 84 may receive power from power source 12. Multiplexer 120, analog-to-digital converter (ADC) 132, finite state machine (FSM) 134, multiplexer 136, registers 144, sum element 152, and amplifier 154 may, in some cases, represent elements of short detection circuitry 36 of FIG. 1.

Multiplexer 120 includes first multiplexer data input 122A and second multiplexer data input 122B (collectively, "multiplexer data inputs 122"). Additionally, multiplexer 122 includes multiplexer data output 124 and multiplexer control input 126. As seen in FIG. 6A, first multiplexer data input 122A is electrically connected to an output of the first LED channel 82 and second multiplexer data input 122B is electrically connected to an output of the second LED channel 84. Multiplexer 120 may control, based on a control signal received at multiplexer control input 126, whether an electrical signal flows across multiplexer 120 from first multiplexer data input 122A to multiplexer data output 124 or whether an electrical signal flows across multiplexer 120 from second multiplexer data input 122B to multiplexer data output 124.

During a test to determine whether a short connection exists between the first LED channel 82 and the second LED channel 84, multiplexer 120 may receive a control signal at multiplexer control input 126 which causes multiplexer 120 to carry an electrical signal from the second multiplexer data input 122B to the multiplexer data output 124. That is, multiplexer 120 carries the electrical signal output from the second LED channel 84 from the second multiplexer data input 122B to the multiplexer data output 124. For example, multiplexer 120 may receive a first electrical signal when the first LED channel 82 and the second LED channel 84 operate in a first state and multiplexer 120 may receive a second electrical signal when the first LED channel 82 and the second LED channel 84 operate in a second state.

ADC 132 may receive one or more analog electrical signals received from multiplexer 120 and convert the one or more analog electrical signals into one or more digital signals. FSM 134 may output one or more control signals to multiplexer 120, multiplexer 136, or other components. Multiplexer 136 includes multiplexer 139 and first multiplexer output 140A and second multiplexer output 140B (collectively, "multiplexer 140"). Registers 144 may receive and store one or more digital signals from multiplexer 136.

For example, a first electrical signal received from the second LED channel 84 may be stored in sample register 148 and a second electrical signal received from the second LED channel 84 may be stored in the output register 150. Amplifier 154 includes first amplifier data input 156A, second amplifier data input 156B, and amplifier data output 158. Amplifier 154 compares a first signal representing a sum of the voltage of the first electrical signal and a threshold voltage difference and a second signal representing a voltage of the second electrical signal. Amplifier 154 may output an amplifier signal which indicates whether a difference between the voltage of the first electrical signal and the voltage of the second electrical signal is greater than the threshold voltage difference value, which in turn indicates whether a short connection exists between the first LED channel 82 and the second LED channel 84.

Figure 6B:
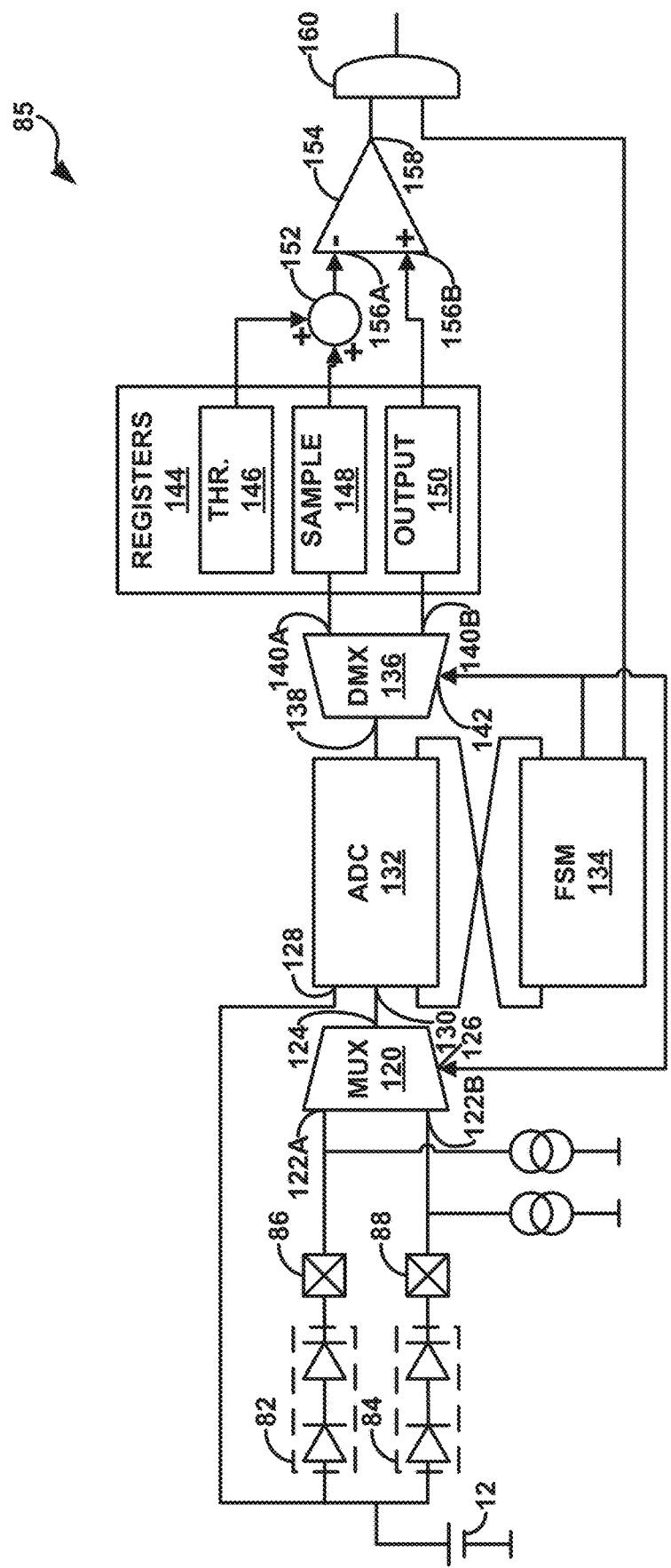
FIG. 6B is a circuit diagram illustrating a fourth example circuit which includes a first LED channel, a second LED channel, and analog and digital circuitry for outputting information indicating whether a short connection exists between the first LED channel and the second LED channel, in accordance with one or more techniques of this disclosure.

FIG. 6B is a circuit diagram illustrating a fourth example circuit 85 which includes a first LED channel 82, a second LED channel 84, and analog and digital circuitry for outputting information indicating whether a short connection exists between the first LED channel 82 and the second LED channel 84, in accordance with one or more techniques of this disclosure. As seen in FIG. 6A, the first LED channel 82 is connected to a first pin 86 and the second LED channel 84 is electrically connected to a second pin 88. The first LED channel 82 and the second LED channel 84 may receive power from power source 12. Multiplexer 120, analog-to-digital converter (ADC) 132, finite state machine (FSM) 134, multiplexer 136, registers 144, sum element 152, and amplifier 154 may, in some cases, represent elements of short detection circuitry 36 of FIG. 1.

The circuit 85 of FIG. 6B may be substantially the same as the circuit 83 of FIG. 6A except that the circuit 85 includes a connection between an output of power source 12 and an input 128 of ADC 132. Multiplexer 120 is connected to ADC 132 via ADC input 130. In some examples, Circuit 85 operates substantially the same as circuit 83 except circuit 85 takes the output of power source 12 into account when determining if the first LED channel 82 and the second LED channel 84 include a short connection.

Figure 7:
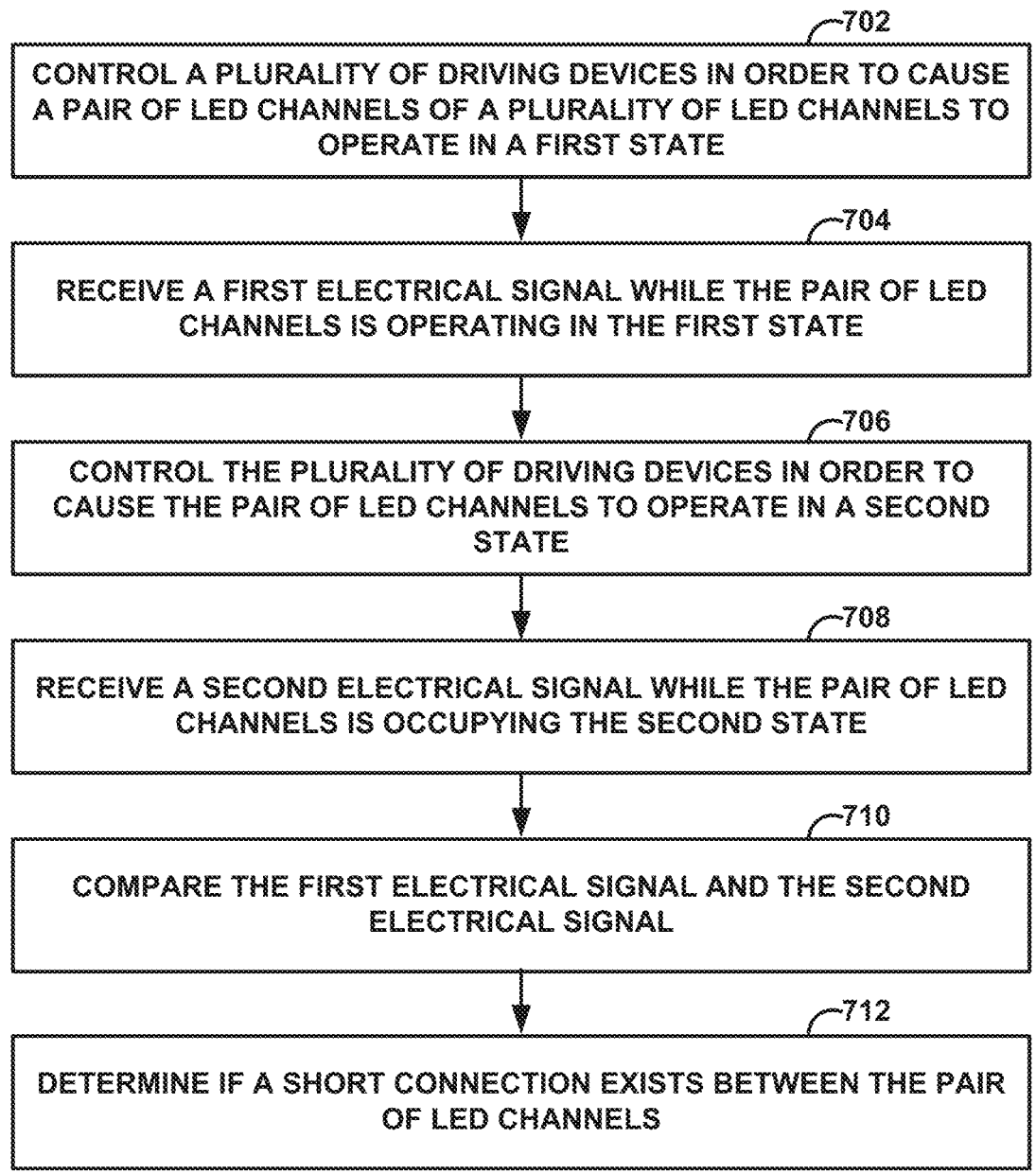
FIG. 7 is a flow diagram illustrating an example operation for determining whether a short connection exists between a pair of LED channels, in accordance with one or more techniques of this disclosure.

FIG. 7 is a flow diagram illustrating an example operation for determining whether a short connection exists between a pair of LED channels, in accordance with one or more techniques of this disclosure. FIG. 7 is described with respect to system 10 of FIG. 1. However, the techniques of FIG. 7 may be performed by different components of system 10 or by additional or alternative systems.

Circuit 14 may control a plurality of driving devices in order to cause a pair of LED channels of a plurality of LED channels 16 to operate in a first state (702). In some examples, each driving device of the plurality of driving devices may be part of a respective driver circuit of a plurality of driver circuits. Each driving device of the plurality of driving devices may control whether a respective LED channel of the plurality of LED channels 16 is turned on or turned off. To cause the pair of driving devices to operate in the first state, the circuit 14 may control a first driving device and a second driving device in order to control a first LED channel and a second LED channel, respectively. Short detection circuitry 36 may receive a first electrical signal while the pair of LED channels is operating in the first state (704). In some examples, short detection circuitry 36 receives the first electrical signal from the second LED channel of the pair of LED channels, and the first electrical signal indicates a voltage output from the second LED channel. In some examples, short detection circuitry 36 receives the first electrical signal from an amplifier which generates the first electrical signal to indicate a difference between a voltage output from the second LED channel and a voltage output from power source 12.

Subsequently, circuit 14 may control the plurality of driving devices in order to cause the pair of LED channels to operate in a second state (706). To cause the pair of driving devices to operate in the second state, the circuit 14 may control the first driving device and the second driving device in order to control the first LED channel and the second LED channel, respectively. Short detection circuitry 36 may receive a second electrical signal while the pair of LED channels is operating in the second state (708). In some examples, short detection circuitry 36 receives the second electrical signal from the second LED channel of the pair of LED channels, and the second electrical signal indicates a voltage output from the second LED channel. In some examples, short detection circuitry 36 receives the second electrical signal from an amplifier which generates the second electrical signal to indicate a difference between a voltage output from the second LED channel and a voltage output from power source 12. Short detection circuitry 36 may compare the first electrical signal and the second electrical signal (710). Based on the comparison, short detection circuitry 36 may determine if a short connection exists between the pair of LED channels (712).

The techniques described in this disclosure may be implemented, at least in part, in hardware, software, firmware, or any combination thereof. For example, various aspects of the described techniques may be implemented within one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The following numbered examples demonstrate one or more aspects of the disclosure.

Example 1. A circuit for detecting one or more short connections in a plurality of light-emitting diode (LED) channels, wherein the circuit comprises processing circuitry configured to: control a plurality of driving devices in order to cause a pair of LED channels of the plurality of LED channels to operate in a first state during a first period of time and operate in a second state during a second period of time; compare a first electrical signal corresponding to the first state of the pair of LED channels and a second electrical signal corresponding to the second state of the pair of LED channels; and determine, based on the comparison of the first electrical signal and the second electrical signal, if a short connection exists between the pair of LED channels.

Example 2. The circuit of example 1, wherein the pair of LED channels includes a first LED channel and a second LED channel, and wherein the processing circuitry is further configured to: receive the first electrical signal while the pair of LED channels is operating in the first state; and receive the second electrical signal while the pair of LED channels is operating in the second state, wherein to compare the first electrical signal and the second electrical signal, the processing circuitry is configured to determine a difference between the first electrical signal and the second electrical signal, and wherein to determine if the short connection exists, the processing circuitry is configured to: compare the difference between the first electrical signal and the second electrical signal with a threshold difference value; and determine if the short connection exists based on the comparison of the difference and the threshold difference value.

Example 3. The circuit of example 2, wherein the first electrical signal represents the output of the second LED channel while the pair of LED channels is operating in the first state, and wherein the second electrical signal represents the output of the second LED channel and an output of the power source while the pair of LED channels is operating in the second state.

Example 4. The circuit of any of examples 2-3, wherein the first electrical signal represents a difference between the output of the second LED channel and an output of a power source configured to supply power to the plurality of LED channels while the pair of LED channels is operating in the first state, and wherein the second electrical signal represents a difference between the output of the second LED channel and an output of the power source while the pair of LED channels is operating in the second state.

Example 5. The circuit of any of examples 2-4, wherein to control the plurality of driving devices in order to cause the pair of LED channels to operate in the first state, the processing circuitry is configured to: control a first LED channel of the pair of LED channels to be turned off; and control a second LED channel of the pair of LED channels to be turned off, wherein to control the plurality of driving devices in order to cause the pair of LED channels to operate in the second state, the processing circuitry is configured to: control the first LED channel of the pair of LED channels to be turned on; and control the second LED channel of the pair of LED channels to be turned off, and wherein to determine if the short connection exists based on the comparison of the difference and the threshold difference value, the processing circuitry is configured to: determine that the short connection exists when the difference is greater than the threshold difference value; and determine that the short connection does not exist when the difference is not greater than the threshold difference value.

Example 6. The circuit of any of examples 2-5, wherein to control the plurality of driving devices in order to cause the pair of LED channels to operate in the first state, the processing circuitry is configured to: control the first LED channel of the pair of LED channels to be turned on; and control the second LED channel of the pair of LED channels to be turned off, wherein to control the plurality of driving devices in order to cause the pair of LED channels to operate in the second state, the processing circuitry is configured to: control the first LED channel of the pair of LED channels to be turned on; and control the second LED channel of the pair of LED channels to be turned on, and wherein to determine if the short connection exists based on the comparison of the difference and the threshold difference value, the processing circuitry is configured to: determine that the short connection does not exist when the difference is greater than the threshold difference value; and determine that the short connection exists when the difference is not greater than the threshold difference value.

Example 7. The circuit of any of examples 2-6, wherein the processing circuitry comprises: a capacitor configured to receive the first electrical signal from the second LED channel of the pair of LED channels; and an amplifier configured to: receive the second electrical signal from the output of the second LED channel of the pair of LED channels; receive a third electrical signal which represents a sum of the first electrical signal output from the capacitor and the threshold difference value; and generate, based on the second electrical signal and third electrical signal, an amplifier signal which indicates whether the short connection exists between the pair of LED channels.

Example 8. The circuit of any of examples 2-7, wherein the processing circuitry comprises: an analog-to-digital converter (ADC) configured to: convert the first electrical signal to a first digital signal; and convert the second electrical signal to a second digital signal; and an amplifier configured to: receive the second digital signal from the ADC; receive a third digital signal which represents a sum of the first digital signal output from the ADC and a threshold difference value; and generate, based on the second digital signal and third digital signal, an amplifier signal which indicates whether the short connection exists between the pair of LED channels.

Example 9. The circuit of any of examples 1-8, wherein the plurality of LED channels are arranged in a sequence of LED channels, and wherein the pair of LED channels represent an adjacent pair of LED channels within the sequence of LED channels.

Example 10. The circuit of any of examples 1-9, wherein the pair of LED channels is a first pair of LED channels, wherein the short connection is a first short connection, and wherein the processing circuitry is further configured to: control the plurality of driving devices in order to cause a second pair of LED channels of the plurality of LED channels to operate in the first state during a third period of time and operate in the second state during a fourth period of time; compare a third electrical signal corresponding to the first state of the pair of LED channels and a fourth electrical signal corresponding to the second state of the pair of LED channels; and determine, based on the comparison of the third electrical signal and the fourth electrical signal, if a second short connection exists between the second pair of LED channels.

Example 11. The circuit of any of examples 1-10, wherein the plurality of LED channels are arranged in a sequence of LED channels, wherein the first pair of LED channels represent a first adjacent pair of LED channels within the sequence of LED channels, wherein the second pair of LED channels represent a second adjacent pair of LED channels within the sequence of LED channels, wherein the first adjacent pair of LED channels includes a first LED channel and a second LED channel, and wherein the second adjacent pair of LED channels includes the second LED channel and a third LED channel.

Example 12. The circuit of any of examples 1-11, further comprising: the plurality of driving devices, wherein each driving device of the plurality of driving devices controls whether a respective LED channel of the plurality of LED channels is turned on or turned off, wherein when the processing circuitry controls a driving device of the plurality of driving devices to turn on an LED channel of the plurality of LED channels, a magnitude of an electrical current output from the LED channel is within a range from 2 milliamperes (mA) to 1000 mA, and wherein when the processing circuitry controls the driving device of the plurality of driving devices to turn off the LED channel of the plurality of LED channels, the magnitude of an electrical current output from the LED channel is within a range from 2 microamperes (µA) to 10 µA.

Example 13. The circuit of any of examples 1-12, wherein each LED channel of the plurality of LED channels includes one or more LEDs.

Example 14. The circuit of any of examples 1-13, wherein each LED channel of the plurality of LED channels includes one or more LEDs, and wherein one or more LED channels of the plurality of LED channels includes two or more LEDs.

Example 15. A method for detecting one or more short connections in a plurality of light-emitting diode (LED) channels, wherein the method comprises: controlling, by processing circuitry, a plurality of driving devices in order to cause a pair of LED channels of the plurality of LED channels to operate in a first state during a first period of time and operate in a second state during a second period of time; comparing, by the processing circuitry, a first electrical signal corresponding to the first state of the pair of LED channels and a second electrical signal corresponding to the second state of the pair of LED channels; and determining, by the processing circuitry based on the comparison of the first electrical signal and the second electrical signal, if a short connection exists between the pair of LED channels.

Example 16. The method of example 15, wherein the pair of LED channels includes a first LED channel and a second LED channel, and wherein the method further comprises: receiving the first electrical signal while the pair of LED channels is operating in the first state; and receiving the second electrical signal while the pair of LED channels is operating in the second state, wherein comparing the first electrical signal and the second electrical signal comprises determining a difference between the first electrical signal and the second electrical signal, and wherein determining if the short connection exists comprises: comparing the difference between the first electrical signal and the second electrical signal with a threshold difference value; and determining if the short connection exists based on the comparison of the difference and the threshold difference value.

Example 17. The method of example 16, wherein controlling the plurality of driving devices in order to cause the pair of LED channels to operate in the first state comprises: controlling a first LED channel of the pair of LED channels to be turned off; and controlling a second LED channel of the pair of LED channels to be turned off, wherein controlling the plurality of driving devices in order to cause the pair of LED channels to operate in the second state comprises: controlling the first LED channel of the pair of LED channels to be turned on; and controlling the second LED channel of the pair of LED channels to be turned off, and wherein determining if the short connection exists based on the comparison of the difference and the threshold difference value comprises: determining that the short connection exists when the difference is greater than the threshold difference value; and determining that the short connection does not exist when the difference is not greater than the threshold difference value.

Example 18. The method of any of examples 16-17, wherein controlling the plurality of driving devices in order to cause the pair of LED channels to operate in the first state comprises: controlling the first LED channel of the pair of LED channels to be turned on; and controlling the second LED channel of the pair of LED channels to be turned off, wherein controlling the plurality of driving devices in order to cause the pair of LED channels to operate in the second state comprises: controlling the first LED channel of the pair of LED channels to be turned on; and controlling the second LED channel of the pair of LED channels to be turned on, and wherein determining if the short connection exists based on the comparison of the difference and the threshold difference value comprises: determining that the short connection does not exist when the difference is greater than the threshold difference value; and determining that the short connection exists when the difference is not greater than the threshold difference value.

Example 19. The method of any of examples 16-18, further comprising: receiving, by a capacitor, the first electrical signal from the second LED channel of the pair of LED channels; and receiving, by an amplifier, the second electrical signal from the output of the second LED channel of the pair of LED channels; receiving, by the amplifier, a third electrical signal which represents a sum of the first electrical signal output from the capacitor and the threshold difference value; and generating, by the amplifier based on the second electrical signal and third electrical signal, an amplifier signal which indicates whether the short connection exists between the pair of LED channels.

Example 20. The method of any of examples 16-19, further comprising: converting, by an analog-to-digital converter (ADC) the first electrical signal to a first digital signal; converting, by the ADC, the second electrical signal to a second digital signal; and receiving, by an amplifier, the second digital signal from the ADC; receiving, by the amplifier, a third digital signal which represents a sum of the first digital signal output from the ADC and a threshold difference value; and generating, by the amplifier based on the second digital signal and third digital signal, an amplifier signal which indicates whether the short connection exists between the pair of LED channels.

Example 21. The method of any of examples 16-20, wherein the pair of LED channels is a first pair of LED channels, wherein the short connection is a first short connection, and wherein the method further comprises: controlling, by the processing circuitry, the plurality of driving devices in order to cause a second pair of LED channels of the plurality of LED channels to operate in the first state during a third period of time and operate in the second state during a fourth period of time; comparing, by the processing circuitry, a third electrical signal corresponding to the first state of the pair of LED channels and a fourth electrical signal corresponding to the second state of the pair of LED channels; and determining, by the processing circuitry based on the comparison of the third electrical signal and the fourth electrical signal, if a second short connection exists between the second pair of LED channels.

Example 22. A system comprising: a plurality of light-emitting diode (LED) channels; and a circuit for detecting one or more short connections in the plurality of LED channels, wherein the circuit comprises processing circuitry configured to: control a plurality of driving devices in order to cause a pair of LED channels of the plurality of LED channels to operate in a first state during a first period of time and operate in a second state during a second period of time; compare a first electrical signal corresponding to the first state of the pair of LED channels and a second electrical signal corresponding to the second state of the pair of LED channels; and determine, based on the comparison of the first electrical signal and the second electrical signal, if a short connection exists between the pair of LED channels.

Various examples of the disclosure have been described. These and other examples are within the scope of the following claims.

What is claimed is:

1. A circuit for detecting one or more short connections in a plurality of light-emitting diode (LED) channels, wherein the circuit comprises processing circuitry configured to:
control a plurality of driving devices in order to cause a pair of LED channels of the plurality of LED channels to operate in a first state during a first period of time and operate in a second state during a second period of time;
compare a first electrical signal corresponding to the first state of the pair of LED channels and a second electrical signal corresponding to the second state of the pair of LED channels; and
determine, based on the comparison of the first electrical signal and the second electrical signal, if a short connection exists between the pair of LED channels.

2. The circuit of claim 1, wherein the pair of LED channels includes a first LED channel and a second LED channel, and wherein the processing circuitry is further configured to:
receive the first electrical signal while the pair of LED channels is operating in the first state; and
receive the second electrical signal while the pair of LED channels is operating in the second state,
wherein to compare the first electrical signal and the second electrical signal, the processing circuitry is configured to determine a difference between the first electrical signal and the second electrical signal, and
wherein to determine if the short connection exists, the processing circuitry is configured to:
compare the difference between the first electrical signal and the second electrical signal with a threshold difference value; and
determine if the short connection exists based on the comparison of the difference and the threshold difference value.

3. The circuit of claim 2,
wherein the first electrical signal represents the output of the second LED channel while the pair of LED channels is operating in the first state, and
wherein the second electrical signal represents the output of the second LED channel and an output of the power source while the pair of LED channels is operating in the second state.

4. The circuit of claim 2,
wherein the first electrical signal represents a difference between the output of the second LED channel and an output of a power source configured to supply power to the plurality of LED channels while the pair of LED channels is operating in the first state, and
wherein the second electrical signal represents a difference between the output of the second LED channel and an output of the power source while the pair of LED channels is operating in the second state.

5. The circuit of claim 2,
wherein to control the plurality of driving devices in order to cause the pair of LED channels to operate in the first state, the processing circuitry is configured to:
control a first LED channel of the pair of LED channels to be turned off; and
control a second LED channel of the pair of LED channels to be turned off,
wherein to control the plurality of driving devices in order to cause the pair of LED channels to operate in the second state, the processing circuitry is configured to:
control the first LED channel of the pair of LED channels to be turned on; and
control the second LED channel of the pair of LED channels to be turned off, and
wherein to determine if the short connection exists based on the comparison of the difference and the threshold difference value, the processing circuitry is configured to:
determine that the short connection exists when the difference is greater than the threshold difference value; and
determine that the short connection does not exist when the difference is not greater than the threshold difference value.

6. The circuit of claim 2,
wherein to control the plurality of driving devices in order to cause the pair of LED channels to operate in the first state, the processing circuitry is configured to:
control the first LED channel of the pair of LED channels to be turned on; and
control the second LED channel of the pair of LED channels to be turned off,
wherein to control the plurality of driving devices in order to cause the pair of LED channels to operate in the second state, the processing circuitry is configured to:
control the first LED channel of the pair of LED channels to be turned on; and
control the second LED channel of the pair of LED channels to be turned on, and
wherein to determine if the short connection exists based on the comparison of the difference and the threshold difference value, the processing circuitry is configured to:
determine that the short connection does not exist when the difference is greater than the threshold difference value; and
determine that the short connection exists when the difference is not greater than the threshold difference value.

7. The circuit of claim 2, wherein the processing circuitry comprises:
a capacitor configured to receive the first electrical signal from the second LED channel of the pair of LED channels; and
an amplifier configured to:
receive the second electrical signal from the output of the second LED channel of the pair of LED channels;
receive a third electrical signal which represents a sum of the first electrical signal output from the capacitor and the threshold difference value; and
generate, based on the second electrical signal and third electrical signal, an amplifier signal which indicates whether the short connection exists between the pair of LED channels.

8. The circuit of claim 2, wherein the processing circuitry comprises:
an analog-to-digital converter (ADC) configured to:
convert the first electrical signal to a first digital signal; and
convert the second electrical signal to a second digital signal; and
an amplifier configured to:
receive the second digital signal from the ADC;

receive a third digital signal which represents a sum of the first digital signal output from the ADC and a threshold difference value; and generate, based on the second digital signal and third digital signal, an amplifier signal which indicates whether the short connection exists between the pair of LED channels.

9. The circuit of claim 1, wherein the plurality of LED channels are arranged in a sequence of LED channels, and wherein the pair of LED channels represent an adjacent pair of LED channels within the sequence of LED channels.

10. The circuit of claim 1, wherein the pair of LED channels is a first pair of LED channels, wherein the short connection is a first short connection, and wherein the processing circuitry is further configured to:

control the plurality of driving devices in order to cause a second pair of LED channels of the plurality of LED channels to operate in the first state during a third period of time and operate in the second state during a fourth period of time;

compare a third electrical signal corresponding to the first state of the pair of LED channels and a fourth electrical signal corresponding to the second state of the pair of LED channels; and determine, based on the comparison of the third electrical signal and the fourth electrical signal, if a second short connection exists between the second pair of LED channels.

11. The circuit of claim 10, wherein the plurality of LED channels are arranged in a sequence of LED channels, wherein the first pair of LED channels represent a first adjacent pair of LED channels within the sequence of LED channels, wherein the second pair of LED channels represent a second adjacent pair of LED channels within the sequence of LED channels, wherein the first adjacent pair of LED channels includes a first LED channel and a second LED channel, and wherein the second adjacent pair of LED channels includes the second LED channel and a third LED channel.

12. The circuit of claim 1, further comprising:

the plurality of driving devices, wherein each driving device of the plurality of driving devices controls whether a respective LED channel of the plurality of LED channels is turned on or turned off, wherein when the processing circuitry controls a driving device of the plurality of driving devices to turn on an LED channel of the plurality of LED channels, a magnitude of an electrical current output from the LED channel is within a range from 2 milliamperes (mA) to 1000 mA, and wherein when the processing circuitry controls the driving device of the plurality of driving devices to turn off the LED channel of the plurality of LED channels, the magnitude of an electrical current output from the LED channel is within a range from 2 microamperes ($\mu A$) to 10 $\mu A$.

13. The circuit of claim 1, wherein each LED channel of the plurality of LED channels includes one or more LEDs.

14. The circuit of claim 1, wherein each LED channel of the plurality of LED channels includes one or more LEDs, and wherein one or more LED channels of the plurality of LED channels includes two or more LEDs.

15. A method for detecting one or more short connections in a plurality of light-emitting diode (LED) channels, wherein the method comprises:

controlling, by processing circuitry, a plurality of driving devices in order to cause a pair of LED channels of the plurality of LED channels to operate in a first state during a first period of time and operate in a second state during a second period of time;

comparing, by the processing circuitry, a first electrical signal corresponding to the first state of the pair of LED channels and a second electrical signal corresponding to the second state of the pair of LED channels; and determining, by the processing circuitry based on the comparison of the first electrical signal and the second electrical signal, if a short connection exists between the pair of LED channels.

16. The method of claim 15, wherein the pair of LED channels includes a first LED channel and a second LED channel, and wherein the method further comprises:

receiving the first electrical signal while the pair of LED channels is operating in the first state; and receiving the second electrical signal while the pair of LED channels is operating in the second state, wherein comparing the first electrical signal and the second electrical signal comprises determining a difference between the first electrical signal and the second electrical signal, and wherein determining if the short connection exists comprises:

comparing the difference between the first electrical signal and the second electrical signal with a threshold difference value; and determining if the short connection exists based on the comparison of the difference and the threshold difference value.

17. The method of claim 16, wherein controlling the plurality of driving devices in order to cause the pair of LED channels to operate in the first state comprises:

controlling a first LED channel of the pair of LED channels to be turned off; and controlling a second LED channel of the pair of LED channels to be turned off, wherein controlling the plurality of driving devices in order to cause the pair of LED channels to operate in the second state comprises:

controlling the first LED channel of the pair of LED channels to be turned on; and controlling the second LED channel of the pair of LED channels to be turned off, and wherein determining if the short connection exists based on the comparison of the difference and the threshold difference value comprises:

determining that the short connection exists when the difference is greater than the threshold difference value; and determining that the short connection does not exist when the difference is not greater than the threshold difference value.

18. The method of claim 16, wherein controlling the plurality of driving devices in order to cause the pair of LED channels to operate in the first state comprises:

controlling the first LED channel of the pair of LED channels to be turned on; and controlling the second LED channel of the pair of LED channels to be turned off, wherein controlling the plurality of driving devices in order to cause the pair of LED channels to operate in the second state comprises:

controlling the first LED channel of the pair of LED channels to be turned on; and controlling the second LED channel of the pair of LED channels to be turned on, and wherein determining if the short connection exists based on the comparison of the difference and the threshold difference value comprises:
- determining that the short connection does not exist when the difference is greater than the threshold difference value; and
- determining that the short connection exists when the difference is not greater than the threshold difference value.

19. The method of claim 16, further comprising:
receiving, by a capacitor, the first electrical signal from the second LED channel of the pair of LED channels; and receiving, by an amplifier, the second electrical signal from the output of the second LED channel of the pair of LED channels;

receiving, by the amplifier, a third electrical signal which represents a sum of the first electrical signal output from the capacitor and the threshold difference value; and generating, by the amplifier based on the second electrical signal and third electrical signal, an amplifier signal which indicates whether the short connection exists between the pair of LED channels.

20. The method of claim 16, further comprising:
converting, by an analog-to-digital converter (ADC) the first electrical signal to a first digital signal;

converting, by the ADC, the second electrical signal to a second digital signal; and receiving, by an amplifier, the second digital signal from the ADC;

receiving, by the amplifier, a third digital signal which represents a sum of the first digital signal output from the ADC and a threshold difference value; and generating, by the amplifier based on the second digital signal and third digital signal, an amplifier signal which indicates whether the short connection exists between the pair of LED channels.

21. The method of claim 15, wherein the pair of LED channels is a first pair of LED channels, wherein the short connection is a first short connection, and wherein the method further comprises:
controlling, by the processing circuitry, the plurality of driving devices in order to cause a second pair of LED channels of the plurality of LED channels to operate in the first state during a third period of time and operate in the second state during a fourth period of time;

comparing, by the processing circuitry, a third electrical signal corresponding to the first state of the pair of LED channels and a fourth electrical signal corresponding to the second state of the pair of LED channels; and determining, by the processing circuitry based on the comparison of the third electrical signal and the fourth electrical signal, if a second short connection exists between the second pair of LED channels.

22. A system comprising:
a plurality of light-emitting diode (LED) channels; and
a circuit for detecting one or more short connections in the plurality of LED channels, wherein the circuit comprises processing circuitry configured to:
- control a plurality of driving devices in order to cause a pair of LED channels of the plurality of LED channels to operate in a first state during a first period of time and operate in a second state during a second period of time;
- compare a first electrical signal corresponding to the first state of the pair of LED channels and a second electrical signal corresponding to the second state of the pair of LED channels; and
- determine, based on the comparison of the first electrical signal and the second electrical signal, if a short connection exists between the pair of LED channels.

* * * * *